(12) United States Patent
Tuttle

(10) Patent No.: US 7,902,643 B2
(45) Date of Patent: Mar. 8, 2011

(54) MICROFEATURE WORKPIECES HAVING INTERCONNECTS AND CONDUCTIVE BACKPLANES, AND ASSOCIATED SYSTEMS AND METHODS

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 860 days.

(21) Appl. No.: 11/514,568

(22) Filed: Aug. 31, 2006

(65) Prior Publication Data

US 2008/0054444 A1    Mar. 6, 2008

(51) Int. Cl.
  *H01L 23/58*  (2006.01)
(52) U.S. Cl. .......................... 257/659; 257/660
(58) Field of Classification Search .................. 257/659
   See application file for complete search history.

(56) References Cited

U.S. PATENT DOCUMENTS

| | | |
|---|---|---|
| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |
| 4,818,728 A | 4/1989 | Rai et al. |
| 4,907,127 A | 3/1990 | Lee |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,006,922 A | 4/1991 | McShane et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |

(Continued)

FOREIGN PATENT DOCUMENTS

DE      10205026 C1      5/2003

(Continued)

OTHER PUBLICATIONS

Aachboun, S. and P. Ranson, "Cryogenic etching of deep narrow trenches in silicon," J. Vac. Sci. Technol. A 18 (4), Jul./Aug 2000, pp. 1848-1852.

(Continued)

*Primary Examiner* — Wael M Fahmy
*Assistant Examiner* — Abul Kalam
(74) *Attorney, Agent, or Firm* — Perkins Coie LLP

(57) ABSTRACT

Microfeature workpieces having interconnects and conductive backplanes and associated systems and methods are disclosed herein. One such device includes a semiconductor substrate having integrated circuitry and terminals electrically coupled to the integrated circuitry. The device also includes electrically conductive interconnects extending through at least a portion of the semiconductor substrate and electrically coupled to corresponding terminals. The device further includes a conductive backplane assembly having a conductive layer at a back side of the semiconductor substrate. One or more of the interconnects are electrically coupled to the conductive layer at the back side of the semiconductor substrate.

22 Claims, 10 Drawing Sheets

U.S. PATENT DOCUMENTS

| | | | |
|---|---|---|---|
| 5,098,864 A | 3/1992 | Mahulikar | |
| 5,102,829 A | 4/1992 | Cohn | |
| 5,123,902 A | 6/1992 | Muller et al. | |
| 5,144,412 A | 9/1992 | Chang et al. | |
| 5,145,099 A | 9/1992 | Wood et al. | |
| 5,158,911 A | 10/1992 | Quentin et al. | |
| 5,200,366 A | 4/1993 | Yamada et al. | |
| 5,219,344 A | 6/1993 | Yoder, Jr. | |
| 5,233,448 A | 8/1993 | Wu et al. | |
| 5,237,148 A | 8/1993 | Aoki et al. | |
| 5,289,631 A | 3/1994 | Koopman et al. | |
| 5,291,062 A | 3/1994 | Higgins, III | |
| 5,292,686 A | 3/1994 | Riley et al. | |
| 5,294,568 A | 3/1994 | McNeilly et al. | |
| 5,304,743 A | 4/1994 | Sen et al. | |
| 5,378,312 A | 1/1995 | Gifford et al. | |
| 5,378,313 A | 1/1995 | Pace | |
| 5,380,681 A | 1/1995 | Hsu et al. | |
| 5,402,435 A | 3/1995 | Shiono et al. | |
| 5,406,630 A | 4/1995 | Piosenka et al. | |
| 5,424,573 A | 6/1995 | Kato et al. | |
| 5,438,212 A | 8/1995 | Okaniwa et al. | |
| 5,447,871 A | 9/1995 | Goldstein | |
| 5,464,960 A | 11/1995 | Hall et al. | |
| 5,481,483 A | 1/1996 | Ebenstein | |
| 5,485,039 A | 1/1996 | Fujita et al. | |
| 5,496,755 A | 3/1996 | Bayraktaroglu | |
| 5,515,167 A | 5/1996 | Ledger et al. | |
| 5,518,956 A | 5/1996 | Liu et al. | |
| 5,550,403 A | 8/1996 | Carichner | |
| 5,585,308 A | 12/1996 | Sardella | |
| 5,585,675 A | 12/1996 | Knopf | |
| 5,614,743 A | 3/1997 | Mochizuki et al. | |
| 5,618,752 A | 4/1997 | Gaul | |
| 5,624,437 A | 4/1997 | Freeman et al. | |
| 5,627,106 A | 5/1997 | Hsu et al. | |
| 5,646,067 A | 7/1997 | Gaul | |
| 5,654,221 A | 8/1997 | Cronin et al. | |
| 5,673,846 A | 10/1997 | Gruber | |
| 5,684,642 A | 11/1997 | Zumoto et al. | |
| 5,690,841 A | 11/1997 | Elderstig et al. | |
| 5,718,791 A | 2/1998 | Spengler et al. | |
| 5,723,904 A | 3/1998 | Shiga et al. | |
| 5,726,493 A | 3/1998 | Yamashita et al. | |
| 5,734,555 A | 3/1998 | McMahon | |
| 5,771,158 A | 6/1998 | Yamagishi et al. | |
| 5,773,359 A | 6/1998 | Mitchell et al. | |
| 5,776,824 A | 7/1998 | Farnworth et al. | |
| 5,807,439 A | 9/1998 | Akatsu et al. | |
| 5,811,799 A | 9/1998 | Wu | |
| 5,821,532 A | 10/1998 | Beaman et al. | |
| 5,825,080 A | 10/1998 | Imaoka et al. | |
| 5,826,628 A | 10/1998 | Hamilton | |
| 5,847,454 A | 12/1998 | Shaw et al. | |
| 5,851,845 A | 12/1998 | Wood et al. | |
| 5,857,963 A | 1/1999 | Pelchy et al. | |
| 5,861,654 A | 1/1999 | Johnson | |
| 5,870,289 A | 2/1999 | Tokuda et al. | |
| 5,870,823 A | 2/1999 | Bezama et al. | |
| 5,893,828 A | 4/1999 | Uram | |
| 5,904,499 A | 5/1999 | Pace | |
| 5,969,422 A | 10/1999 | Ting et al. | |
| 5,998,240 A | 12/1999 | Hamilton et al. | |
| 5,998,292 A | 12/1999 | Black et al. | |
| 6,004,867 A | 12/1999 | Kim et al. | |
| 6,008,070 A | 12/1999 | Farnworth | |
| 6,008,914 A | 12/1999 | Sasagawa et al. | |
| 6,080,291 A | 6/2000 | Woodruff et al. | |
| 6,097,087 A | 8/2000 | Farnworth et al. | |
| 6,103,547 A | 8/2000 | Corisis et al. | |
| 6,107,180 A | 8/2000 | Munroe et al. | |
| 6,107,186 A | 8/2000 | Erb | |
| 6,107,679 A | 8/2000 | Noguchi et al. | |
| 6,110,825 A | 8/2000 | Mastromatteo et al. | |
| 6,114,240 A | 9/2000 | Akram et al. | |
| 6,119,335 A | 9/2000 | Park et al. | |
| 6,124,634 A | 9/2000 | Akram et al. | |
| 6,130,141 A | 10/2000 | Degani et al. | |
| 6,133,622 A | 10/2000 | Corisis et al. | |
| 6,137,163 A | 10/2000 | Kim et al. | |
| 6,137,182 A | 10/2000 | Hause et al. | |
| 6,140,604 A | 10/2000 | Somers et al. | |
| 6,143,588 A | 11/2000 | Glenn | |
| 6,148,509 A | 11/2000 | Schoenfeld et al. | |
| 6,159,764 A | 12/2000 | Kinsman et al. | |
| 6,180,518 B1 | 1/2001 | Layadi et al. | |
| 6,184,060 B1 | 2/2001 | Siniaguine | |
| 6,184,465 B1 | 2/2001 | Corisis | |
| 6,187,615 B1 | 2/2001 | Kim et al. | |
| 6,191,487 B1 | 2/2001 | Rodenbeck et al. | |
| 6,203,539 B1 | 3/2001 | Shimmick et al. | |
| 6,221,769 B1 | 4/2001 | Dhong et al. | |
| 6,222,136 B1 | 4/2001 | Appelt et al. | |
| 6,222,270 B1 | 4/2001 | Lee et al. | |
| 6,228,687 B1 | 5/2001 | Akram et al. | |
| 6,229,202 B1 | 5/2001 | Corisis | |
| 6,235,552 B1 | 5/2001 | Kwon et al. | |
| 6,246,108 B1 | 6/2001 | Corisis et al. | |
| 6,252,300 B1 | 6/2001 | Hsuan et al. | |
| 6,268,114 B1 | 7/2001 | Wen et al. | |
| 6,271,580 B1 | 8/2001 | Corisis | |
| 6,277,757 B1 | 8/2001 | Lin et al. | |
| 6,291,894 B1 | 9/2001 | Farnworth et al. | |
| 6,294,837 B1 | 9/2001 | Akram et al. | |
| 6,297,155 B1 | 10/2001 | Simpson et al. | |
| 6,324,253 B1 | 11/2001 | Yuyama et al. | |
| 6,326,689 B1 | 12/2001 | Thomas | |
| 6,326,697 B1 | 12/2001 | Farnworth | |
| 6,329,632 B1 | 12/2001 | Fournier et al. | |
| 6,341,009 B1 | 1/2002 | O'Connor et al. | |
| 6,344,976 B1 | 2/2002 | Schoenfeld et al. | |
| 6,359,254 B1 | 3/2002 | Brown | |
| 6,359,328 B1 | 3/2002 | Dubin | |
| 6,372,548 B2 | 4/2002 | Bessho et al. | |
| 6,388,208 B1 | 5/2002 | Kiani et al. | |
| 6,391,770 B2 | 5/2002 | Kosaki et al. | |
| 6,406,636 B1 | 6/2002 | Vaganov | |
| 6,432,821 B1 | 8/2002 | Dubin et al. | |
| 6,433,303 B1 | 8/2002 | Liu et al. | |
| 6,433,304 B2 | 8/2002 | Okumura et al. | |
| 6,437,284 B1 | 8/2002 | Okamoto et al. | |
| 6,437,441 B1 | 8/2002 | Yamamoto et al. | |
| 6,441,487 B2 | 8/2002 | Elenius et al. | |
| 6,444,576 B1 | 9/2002 | Kong | |
| 6,448,106 B1 | 9/2002 | Wang et al. | |
| 6,452,270 B1 | 9/2002 | Huang et al. | |
| 6,455,425 B1 | 9/2002 | Besser et al. | |
| 6,457,515 B1 | 10/2002 | Vafai et al. | |
| 6,459,039 B1 | 10/2002 | Bezama et al. | |
| 6,459,150 B1 | 10/2002 | Wu et al. | |
| 6,468,889 B1 | 10/2002 | Iacoponi et al. | |
| 6,486,083 B1 | 11/2002 | Mizuno et al. | |
| 6,486,549 B1 | 11/2002 | Chiang et al. | |
| 6,521,516 B2 | 2/2003 | Monzon et al. | |
| 6,521,530 B2 | 2/2003 | Peters et al. | |
| 6,534,192 B1 | 3/2003 | Abys et al. | |
| 6,534,863 B2 | 3/2003 | Walker et al. | |
| 6,545,563 B1 | 4/2003 | Smith | |
| 6,555,782 B2 | 4/2003 | Isaji et al. | |
| 6,560,047 B2 | 5/2003 | Choi et al. | |
| 6,569,711 B1 | 5/2003 | Susko et al. | |
| 6,569,777 B1 | 5/2003 | Hsu et al. | |
| 6,572,606 B2 | 6/2003 | Kliewer et al. | |
| 6,576,531 B2 | 6/2003 | Peng et al. | |
| 6,580,174 B2 | 6/2003 | McCormick et al. | |
| 6,582,987 B2 | 6/2003 | Jun et al. | |
| 6,582,992 B2 | 6/2003 | Poo et al. | |
| 6,593,644 B2 | 7/2003 | Chiu et al. | |
| 6,599,436 B1 | 7/2003 | Matzke et al. | |
| 6,606,251 B1 | 8/2003 | Kenny, Jr. et al. | |
| 6,614,033 B2 | 9/2003 | Suguro et al. | |
| 6,620,031 B2 | 9/2003 | Renteln | |
| 6,620,731 B1 | 9/2003 | Farnworth et al. | |
| 6,621,045 B1 | 9/2003 | Liu et al. | |
| 6,638,410 B2 | 10/2003 | Chen et al. | |
| 6,653,236 B2 | 11/2003 | Wai et al. | |
| 6,658,818 B2 | 12/2003 | Kurth et al. | |

| Patent No. | Date | Inventor(s) |
|---|---|---|
| 6,660,622 B2 | 12/2003 | Chen et al. |
| 6,660,630 B1 | 12/2003 | Chang et al. |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,746,971 B1 | 6/2004 | Ngo et al. |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel et al. |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,841,849 B2 | 1/2005 | Miyazawa |
| 6,847,109 B2 | 1/2005 | Shim |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,111,149 B2 | 9/2006 | Eilert |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Meyers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |
| 7,378,726 B2 | 5/2008 | Punzalan et al. |
| 7,408,265 B2 | 8/2008 | Holscher et al. |
| 7,449,098 B1 | 11/2008 | Mayer et al. |
| 7,491,582 B2 | 2/2009 | Yokoyama et al. |
| 7,498,661 B2 | 3/2009 | Matsuo |
| 2001/0020739 A1 | 9/2001 | Honda |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0094607 A1 | 7/2002 | Gebauer et al. |
| 2002/0096729 A1 | 7/2002 | Tu et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2004/0265562 A1 | 12/2004 | Uzoh et al. |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0189637 A1 | 9/2005 | Okayama et al. |
| 2005/0191861 A1 | 9/2005 | Verhaverbeke |

| | | | | | | |
|---|---|---|---|---|---|---|
| 2005/0194169 A1 | 9/2005 | Tonomura | | 2007/0032061 A1 | 2/2007 | Farnworth et al. |
| 2005/0208766 A1 | 9/2005 | Kirby et al. | | 2007/0035033 A1 | 2/2007 | Ozguz et al. |
| 2005/0227382 A1 | 10/2005 | Hui | | 2007/0037379 A1 | 2/2007 | Enquist et al. |
| 2005/0231626 A1 | 10/2005 | Tuttle et al. | | 2007/0042598 A1 | 2/2007 | Park |
| 2005/0236708 A1 | 10/2005 | Farnworth et al. | | 2007/0045120 A1 | 3/2007 | Tiwari et al. |
| 2005/0247894 A1 | 11/2005 | Watkins et al. | | 2007/0045388 A1 | 3/2007 | Farnworth et al. |
| 2005/0253213 A1 | 11/2005 | Jiang et al. | | 2007/0045515 A1 | 3/2007 | Farnworth et al. |
| 2005/0254133 A1 | 11/2005 | Akram et al. | | 2007/0045632 A1 | 3/2007 | Oliver et al. |
| 2005/0258530 A1 | 11/2005 | Vindasius et al. | | 2007/0045779 A1 | 3/2007 | Hiatt |
| 2005/0272221 A1 | 12/2005 | Yen et al. | | 2007/0045806 A1 | 3/2007 | Hsuan |
| 2005/0275048 A1 | 12/2005 | Farnworth et al. | | 2007/0045812 A1 | 3/2007 | Heng |
| 2005/0275049 A1 | 12/2005 | Kirby et al. | | 2007/0045826 A1 | 3/2007 | Lee et al. |
| 2005/0275051 A1 | 12/2005 | Farnworth et al. | | 2007/0045834 A1 | 3/2007 | Chong et al. |
| 2005/0275750 A1 | 12/2005 | Akram et al. | | 2007/0048896 A1 | 3/2007 | Andry et al. |
| 2005/0277293 A1 | 12/2005 | Kim et al. | | 2007/0048994 A1 | 3/2007 | Tuttle |
| 2005/0282374 A1 | 12/2005 | Hwang et al. | | 2007/0049016 A1 | 3/2007 | Hiatt et al. |
| 2005/0285154 A1 | 12/2005 | Akram et al. | | 2007/0049019 A1 | 3/2007 | Wai et al. |
| 2006/0003566 A1 | 1/2006 | Emesh | | 2007/0057028 A1 | 3/2007 | Lake et al. |
| 2006/0011809 A1 | 1/2006 | Farnworth et al. | | 2007/0077753 A1 | 4/2007 | Iwatake et al. |
| 2006/0014313 A1 | 1/2006 | Hall et al. | | 2007/0082427 A1 | 4/2007 | Shirahama et al. |
| 2006/0023107 A1 | 2/2006 | Bolken et al. | | 2007/0096263 A1 | 5/2007 | Furukawa et al. |
| 2006/0024856 A1 | 2/2006 | Derderian et al. | | 2007/0099395 A1 | 5/2007 | Sridhar et al. |
| 2006/0035402 A1 | 2/2006 | Street et al. | | 2007/0111386 A1 | 5/2007 | Kim et al. |
| 2006/0035415 A1 | 2/2006 | Wood et al. | | 2007/0122940 A1 | 5/2007 | Gautham |
| 2006/0038183 A1 | 2/2006 | Oliver | | 2007/0138562 A1 | 6/2007 | Trezza |
| 2006/0038272 A1 | 2/2006 | Edwards | | 2007/0145563 A1 | 6/2007 | Punzalan et al. |
| 2006/0040421 A1 | 2/2006 | Farnworth et al. | | 2007/0152342 A1 | 7/2007 | Tsao et al. |
| 2006/0040428 A1 | 2/2006 | Johnson | | 2007/0155997 A1 | 7/2007 | Li et al. |
| 2006/0042952 A1 | 3/2006 | Oliver et al. | | 2007/0158839 A1 | 7/2007 | Trezza |
| 2006/0043262 A1 | 3/2006 | Akram | | 2007/0158853 A1 | 7/2007 | Sinha |
| 2006/0043509 A1 | 3/2006 | Watkins et al. | | 2007/0161235 A1 | 7/2007 | Trezza |
| 2006/0043512 A1 | 3/2006 | Oliver et al. | | 2007/0166991 A1 | 7/2007 | Sinha |
| 2006/0043569 A1 | 3/2006 | Benson et al. | | 2007/0166997 A1 | 7/2007 | Knorr |
| 2006/0043599 A1 | 3/2006 | Akram et al. | | 2007/0167004 A1 | 7/2007 | Trezza |
| 2006/0044433 A1 | 3/2006 | Akram | | 2007/0170574 A1 | 7/2007 | Lauxtermann et al. |
| 2006/0046332 A1 | 3/2006 | Derderian et al. | | 2007/0178694 A1 | 8/2007 | Hiatt |
| 2006/0046438 A1 | 3/2006 | Kirby | | 2007/0182020 A1 | 8/2007 | Trezza et al. |
| 2006/0046468 A1 | 3/2006 | Akram et al. | | 2007/0190803 A1 | 8/2007 | Singh et al. |
| 2006/0046471 A1 | 3/2006 | Kirby et al. | | 2007/0197013 A1 | 8/2007 | Trezza |
| 2006/0057776 A1 | 3/2006 | Tao | | 2007/0202617 A1 | 8/2007 | Hembree |
| 2006/0057836 A1 | 3/2006 | Nagarajan et al. | | 2007/0222050 A1 | 9/2007 | Lee et al. |
| 2006/0071347 A1 | 4/2006 | Dotta | | 2007/0222054 A1 | 9/2007 | Hembree |
| 2006/0148250 A1 | 7/2006 | Kirby | | 2007/0228576 A1 | 10/2007 | Trezza |
| 2006/0151880 A1 | 7/2006 | Tang et al. | | 2007/0228926 A1 | 10/2007 | Teo et al. |
| 2006/0154153 A1 | 7/2006 | Chiang et al. | | 2007/0262424 A1 | 11/2007 | Hiatt |
| 2006/0160367 A1 | 7/2006 | Wai et al. | | 2007/0267138 A1 | 11/2007 | White et al. |
| 2006/0177959 A1 | 8/2006 | Boettiger et al. | | 2007/0281473 A1 | 12/2007 | Clark et al. |
| 2006/0177999 A1 | 8/2006 | Hembree et al. | | 2007/0293040 A1 | 12/2007 | Emesh et al. |
| 2006/0180941 A1 | 8/2006 | Kirby et al. | | 2008/0006850 A1 | 1/2008 | Ribnicek et al. |
| 2006/0186097 A1 | 8/2006 | Watkins et al. | | 2008/0050904 A1 | 2/2008 | Lake |
| 2006/0186492 A1 | 8/2006 | Boettiger et al. | | 2008/0050911 A1 | 2/2008 | Borthakur |
| 2006/0191882 A1 | 8/2006 | Watkins et al. | | 2008/0057620 A1 | 3/2008 | Pratt |
| 2006/0195729 A1 | 8/2006 | Huppenthal et al. | | 2008/0079120 A1 | 4/2008 | Foster et al. |
| 2006/0199363 A1 | 9/2006 | Kirby et al. | | 2008/0079121 A1 | 4/2008 | Han |
| 2006/0204651 A1 | 9/2006 | Wai et al. | | 2008/0081386 A1 | 4/2008 | Raravikar et al. |
| 2006/0208360 A1 | 9/2006 | Yiu et al. | | 2008/0081398 A1 | 4/2008 | Lee et al. |
| 2006/0216862 A1 | 9/2006 | Rigg et al. | | 2008/0265933 A1 | 10/2008 | Tanioka et al. |
| 2006/0223301 A1 | 10/2006 | Vanhaelemeersch et al. | | 2008/0299759 A1 | 12/2008 | Chatterjee et al. |
| 2006/0249849 A1 | 11/2006 | Cohen | | 2008/0299762 A1 | 12/2008 | Mathew et al. |
| 2006/0252254 A1 | 11/2006 | Basol | | 2008/0318361 A1 | 12/2008 | Han et al. |
| 2006/0252262 A1 | 11/2006 | Kazemi | | 2009/0007934 A1 | 1/2009 | Hutto |
| 2006/0255443 A1 | 11/2006 | Hwang et al. | | 2009/0014859 A1 | 1/2009 | Jeung et al. |
| 2006/0264041 A1 | 11/2006 | Rigg et al. | | 2009/0057912 A1 | 3/2009 | Kheng |
| 2006/0270108 A1 | 11/2006 | Farnworth et al. | | 2009/0091962 A1 | 4/2009 | Chung et al. |
| 2006/0278979 A1 | 12/2006 | Rangel | | 2009/0127668 A1 | 5/2009 | Choi |
| 2006/0278980 A1 | 12/2006 | Trezza et al. | | 2009/0146312 A1 | 6/2009 | Sulfridge |
| 2006/0278988 A1 | 12/2006 | Trezza et al. | | 2009/0166846 A1 | 7/2009 | Pratt et al. |
| 2006/0278989 A1 | 12/2006 | Trezza | | 2009/0180257 A1 | 7/2009 | Park et al. |
| 2006/0281224 A1 | 12/2006 | Edelstein et al. | | 2009/0224405 A1 | 9/2009 | Chiou et al. |
| 2006/0281243 A1 | 12/2006 | Trezza | | 2009/0283898 A1 | 11/2009 | Janzen et al. |
| 2006/0289967 A1 | 12/2006 | Heck et al. | | 2009/0315154 A1 | 12/2009 | Kirby et al. |
| 2006/0289968 A1 | 12/2006 | Sulfridge | | 2009/0321947 A1 | 12/2009 | Pratt |
| 2006/0290001 A1 | 12/2006 | Sulfridge | | | | |
| 2006/0292877 A1 | 12/2006 | Lake | | | | |

FOREIGN PATENT DOCUMENTS

| | | |
|---|---|---|
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |

| | | | |
|---|---|---|---|
| EP | 0127946 | A1 | 12/1984 |
| EP | 1154474 | A1 | 11/2001 |
| EP | 1415950 | A2 | 5/2004 |
| JP | 63052432 | A | 3/1988 |
| JP | 01252308 | A | 10/1989 |

| | | |
|---|---|---|
| JP | 02235589 A | 9/1990 |
| JP | 05104316 A | 4/1993 |
| JP | 2001077496 A | 3/2001 |
| JP | 2001082931 A | 3/2001 |
| JP | 2001298147 A | 10/2001 |
| JP | 2002018585 A | 1/2002 |
| JP | 2005093980 A | 4/2005 |
| JP | 2005-310817 | 11/2005 |
| KR | 20010018694 | 3/2001 |
| KR | 20020022122 A | 3/2002 |
| KR | 20020061812 A | 7/2002 |
| TW | 250597 B | 3/2006 |
| WO | 2004109770 A2 | 12/2004 |
| WO | 2005022965 A2 | 3/2005 |
| WO | 2005036940 A1 | 4/2005 |
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Blackburn, J.M. et al., "Deposition of Conformal Copper and Nickel Films from Supercritical Carbon Dioxide," *Science*, vol. 94, Oct. 2001, pp. 141-145.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

Jang, D.M. et al., "Development and Evaluation of 3-D SiP with Vertically Interconnected Through Silicon Vias (TSV)," Proceedings of the 57th Electronic Components and Technology Conference, IEEE, May 29 2007-Jun. 1 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Morrow, P.R. et al., "Three-Dimensional Wafer Stacking Via Cu-Cu Bonding Integrated With 65-nm Strained-Si/ Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al. "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using MORIO High Density Plasmas," presented at the 197th Meeting of The Electrochemical Society, Toronto 2000, <http://www.trikon.corn/pdfs/ECS2b.pdf>.

Trigas, C., "System-In-Package or System-On-Chip?," EE Times, Sep. 19, 2003, <http://www.eetimes.com/story/OEG20030919S0049>.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

International Search Report and Written Opinion for International Application No. PCT/US2007/075638, mailed Mar. 4, 2008.

Moffat, T.P., et al. "Superconformal film growth; Mechanism and quantification," IBM J. Res. & Dev., vol. 49, No. 1, pp. 19-36, Jan. 2005.

Vereecken, P.M. et al., "The chemistry of additives in damascene copper plating," IBM J. Res. & Dev., vol. 49, No. 1, pp. 3-18, Jan. 2005.

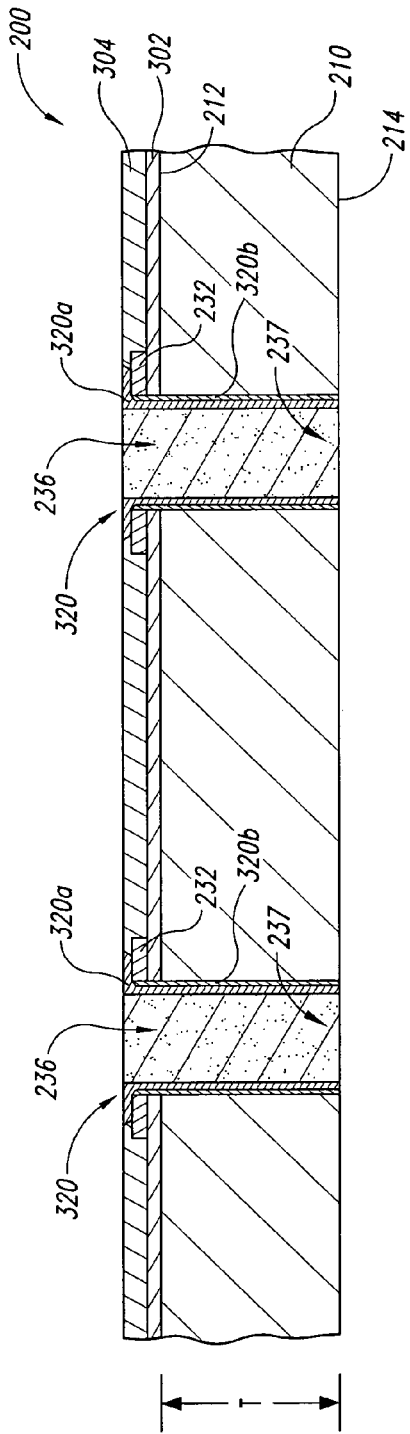
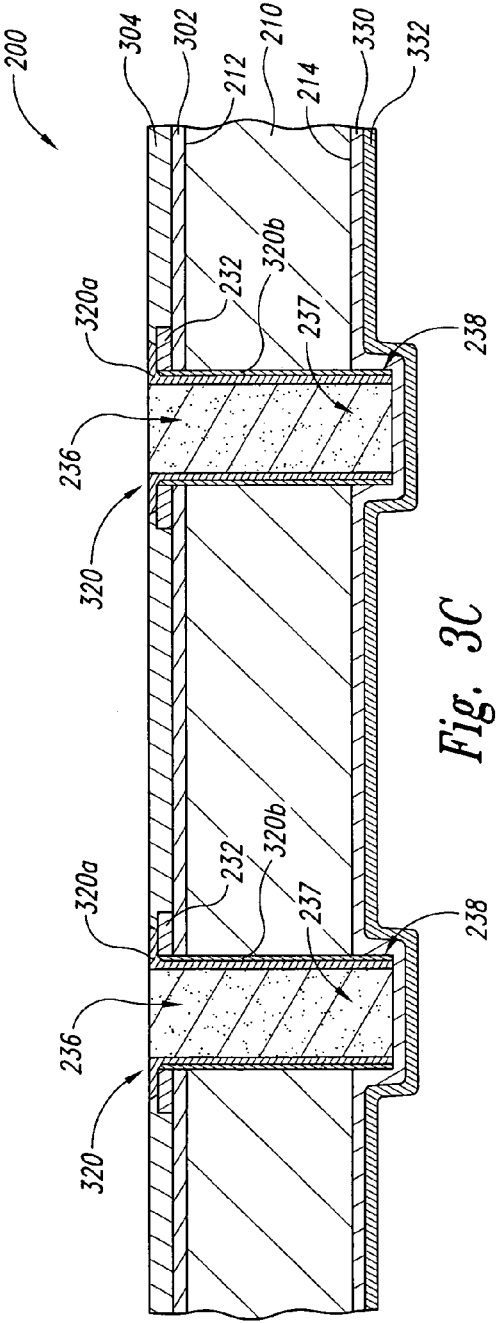

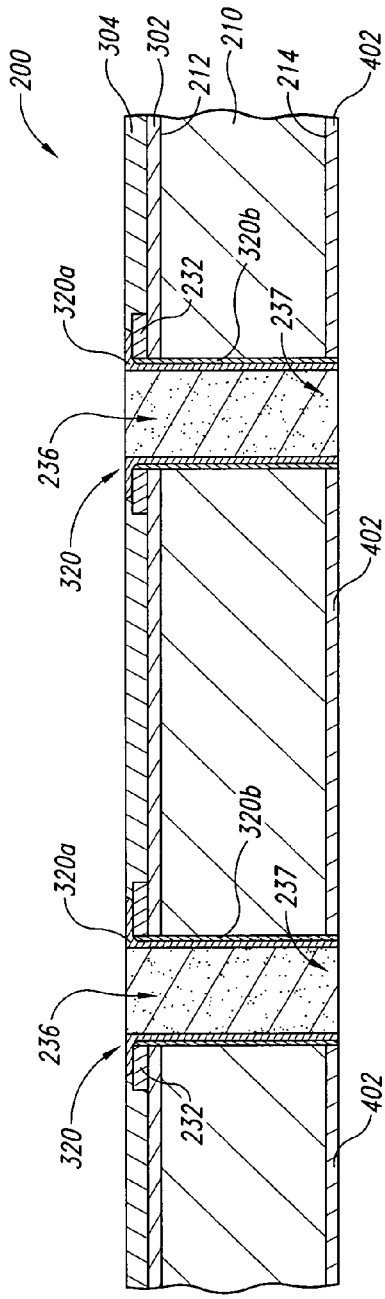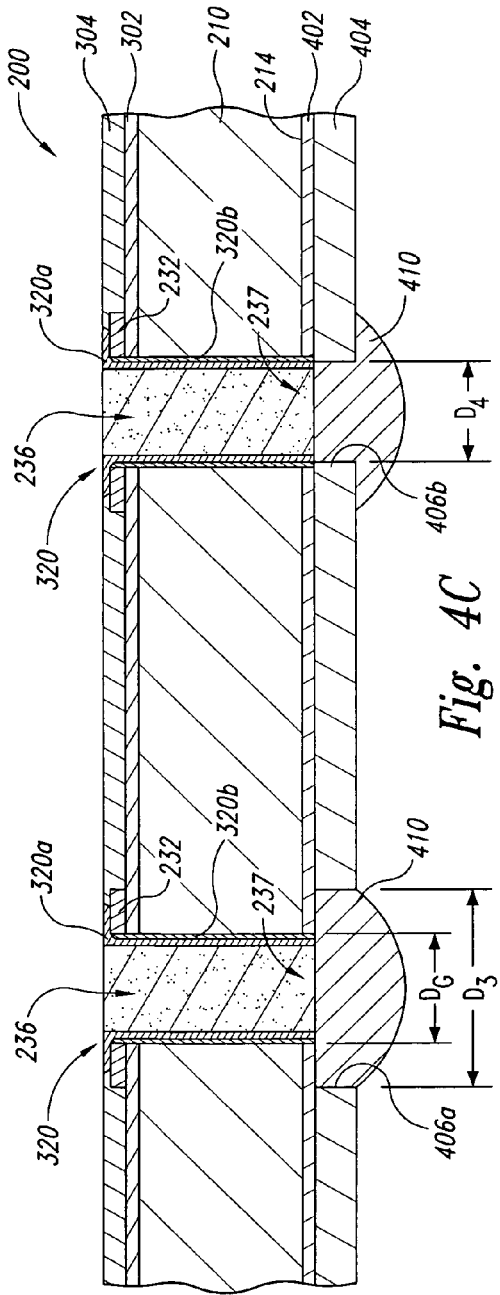

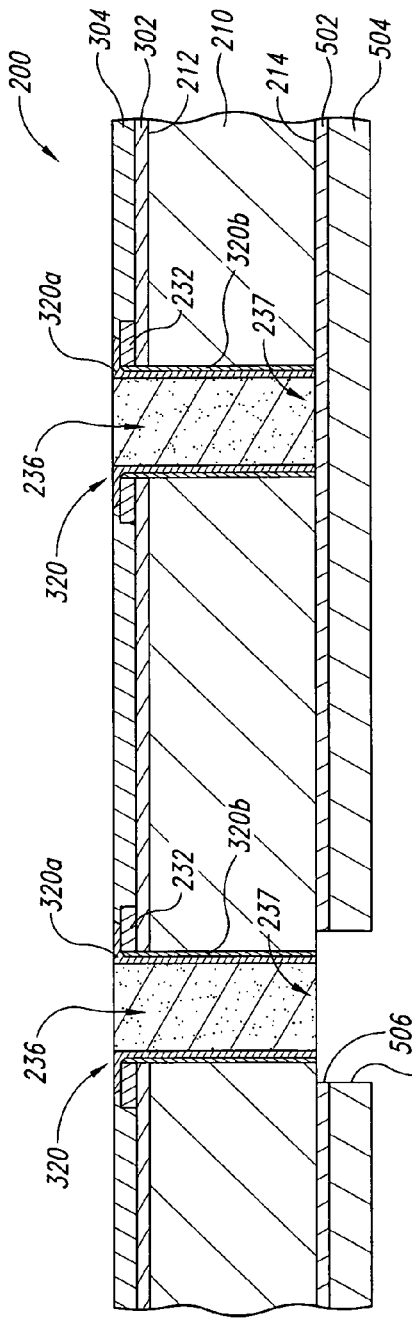
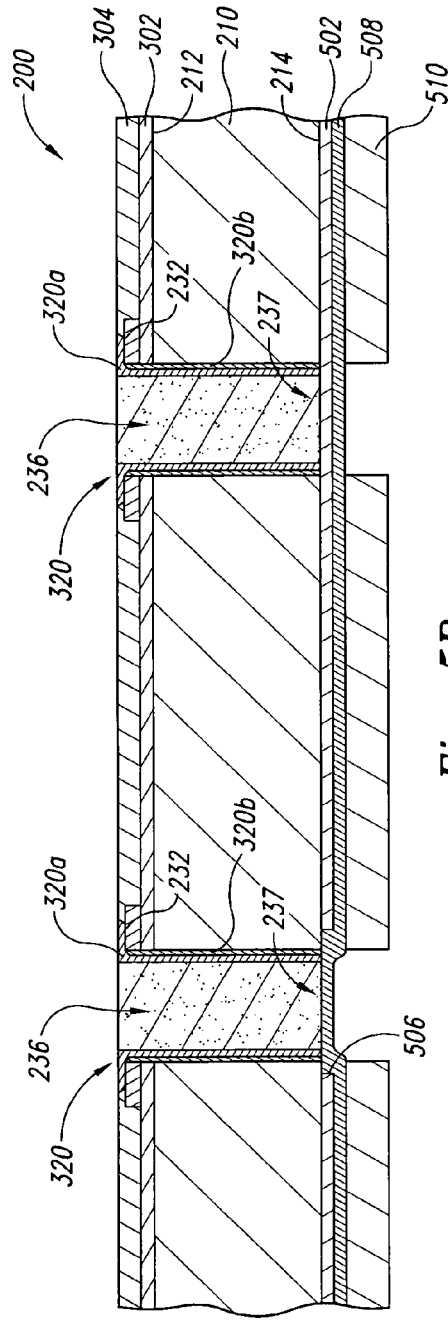
Fig. 5A
Fig. 5B

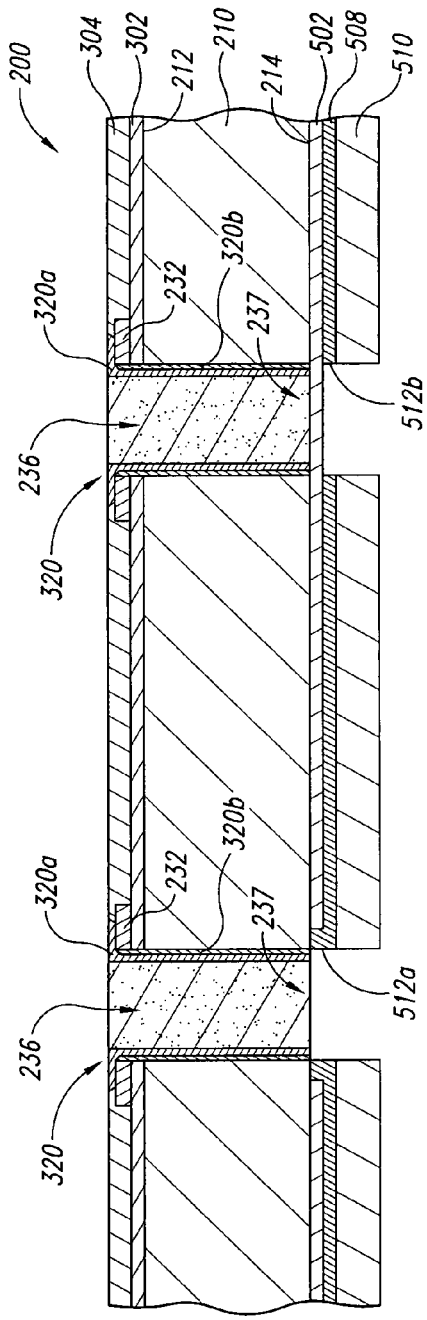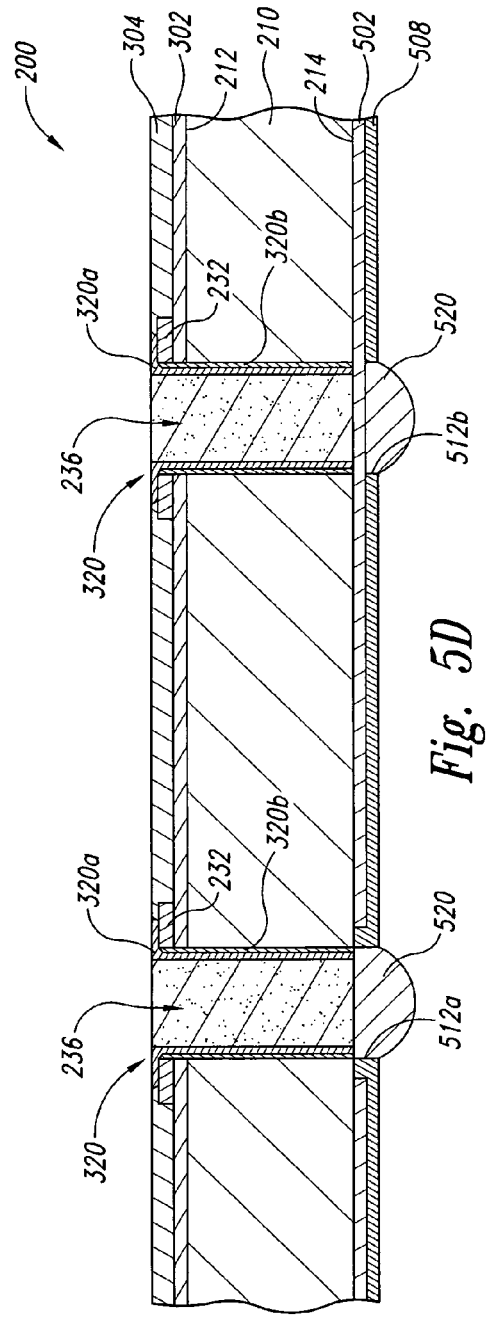

US 7,902,643 B2

MICROFEATURE WORKPIECES HAVING INTERCONNECTS AND CONDUCTIVE BACKPLANES, AND ASSOCIATED SYSTEMS AND METHODS

TECHNICAL FIELD

The present disclosure is directed generally toward microfeature workpieces having interconnects and conductive backplanes, and associated systems and methods.

BACKGROUND

Processors, memory devices, imagers and other types of microelectronic devices are often manufactured on semiconductor workpieces or other types of workpieces. In a typical application, several individual dies (e.g., devices) are fabricated on a single workpiece using sophisticated and expensive equipment and processes. Individual dies generally include an integrated circuit and a plurality of bond-pads coupled to the integrated circuit. The bond-pads provide external electrical contacts on the die through which supply voltage, signals, etc., are transmitted to and from the integrated circuit. The bond-pads are usually very small, and they are arranged in an array having a fine pitch between bond-pads. The dies can also be quite delicate. As a result, after fabrication, the dies are packaged to protect the dies and to connect the bond-pads to another array of larger terminals that is easier to connect to a printed circuit board. The dies can be packaged after cutting the workpiece to separate the dies (die-level packaging), or the dies can be packaged before cutting the workpiece (wafer-level packaging).

Conventional die-level packaged microelectronic devices include a microelectronic die, an interposer substrate or lead frame attached to the die, and a molded casing around the die. The bond-pads of the die are typically coupled to terminals on the interposer substrate or the lead frame. In addition to the terminals, the interposer substrate also includes ball-pads coupled to the terminals by conductive traces supported in a dielectric material. Solder balls can be attached to the ball-pads in one-to-one correspondence to form a "ball-grid array." Packaged microelectronic devices with ball-grid arrays are generally higher-grade packages having lower profiles and higher pin counts than conventional packages using lead frames.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger ball-grid arrays and thus larger footprints. One technique for increasing the component density of microelectronic devices within a given footprint is to stack one device on top of another.

One concern with many high-density packaged microelectronic devices is electromagnetic emissions or radiation generated by the devices during operation. Such electromagnetic disturbances are often referred to as electromagnetic interference ("EMI"). EMI within a particular system or device generally occurs as a result of the generation and/or transmission of electromagnetic radiation by integrated circuits, power supplies, or other radiation sources. Left unchecked, EMI can produce a number of undesirable effects. For example, EMI can interfere with or impair the operation and integrity of unshielded equipment and/or systems proximate to the source of the emissions. Furthermore, EMI can significantly degrade or otherwise negatively affect the performance of unshielded devices.

One approach to addressing the problems with EMI is to shield or ground the integrated circuitry within packaged microelectronic devices. A conventional method for shielding lead frame devices, for example, includes forming a conductive backplane on a back side of the wafer. Portions of the lead frame can then be electrically coupled to the backplane, and one or more bond-pads can be electrically coupled to the backplane via the corresponding portions of the lead frame to ground the device. One significant drawback with this approach, however, is that it is not suitable for devices with small arrays of back side contacts (e.g., ball-grid arrays) because (a) many of the ball-pads or back side contacts should not be grounded or otherwise connected in common, and (b) the remaining ball-pads or back side contacts cannot be connected to the backplane using wire-bonding or other conventional techniques. Accordingly, there is a need to provide the methods for packaging microelectronic devices having small arrays of back side contacts and conductive backplanes.

BRIEF DESCRIPTION OF THE DRAWINGS

FIGS. 3A-3F are schematic, side cross-sectional views illustrating various stages in a method for forming a conductive backplane in accordance with an embodiment of the invention.

FIGS. 4A-4C are schematic, side cross-sectional views illustrating various stages in a method for forming a conductive backplane in accordance with another embodiment of the invention.

FIGS. 5A-5D are schematic, side cross-sectional views illustrating various stages in a method for forming a conductive backplane in accordance with still another embodiment of the invention.

DETAILED DESCRIPTION

The following disclosure describes several embodiments of methods for forming conductive backplanes on microfeature workpieces having interconnects, and devices formed using such methods. As used herein, the terms "microfeature workpiece" and "workpiece" refer to substrates on and/or in which microfeature electronic devices are integrally formed. A microfeature workpiece can include a wafer and/or individual dies or combinations of dies that make up the wafer. Typical electronic devices formed on and/or in microfeature workpieces include processors, memory, imagers, thin-film recording heads, data storage elements, and other products with integrated circuits. Micromachines, microfluidic devices and other micromechanical devices are included within this definition because they are manufactured using much of the same technology that is used in the fabrication of integrated circuits. The substrates can be semi-conductive pieces (e.g., doped silicon wafers, gallium arsenide wafers, or other semiconductor wafers), non-conductive pieces (e.g., various ceramic substrates), or conductive pieces. In some cases, the workpieces are generally round, and in other cases the workpieces can have other shapes, including rectilinear shapes. Several embodiments of methods for forming conductive backplanes in connection with microfeature workpiece fabrication are described below. A person skilled in the relevant art will understand, however, that the invention has additional embodiments, and that the invention may be practiced without several of the details of the embodiments described below with reference to FIGS. 1A-7.

Figure 1A:
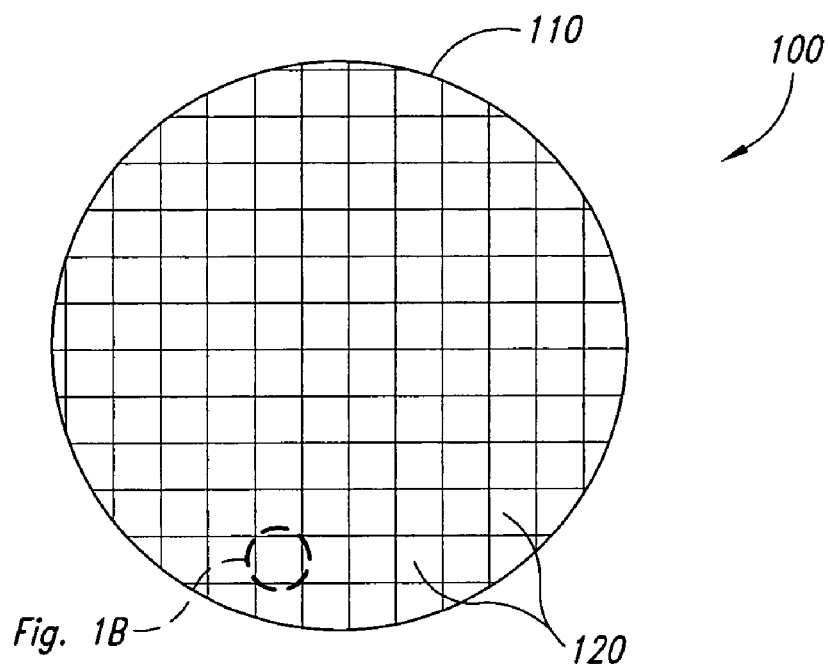
FIG. 1A is a partially schematic illustration of a representative microfeature workpiece carrying microfeature dies configured in accordance with embodiments of the invention.
Figure 1B:
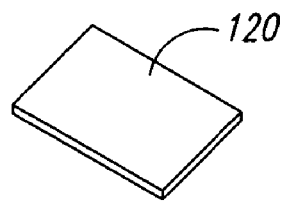
FIG. 1B is a schematic illustration of a microfeature die singulated from the workpiece shown in FIG. 1A.

FIG. 1A is a microfeature workpiece 100 in the form of a semiconductor wafer 110 that includes multiple microfeature dies 120. At least some of the processes described below may be conducted on the microfeature workpiece 100 at the wafer level, and other processes may be conducted on the individual microfeature dies 120 of the microfeature workpiece 100 after the dies 120 have been singulated from the larger wafer 110. Accordingly, unless otherwise noted, structures and methods described below in the context of a microfeature workpiece can apply to the wafer 110, the dies 120 that are formed from the wafer 110, and/or an assembly of one or more dies 120 in a stacked-die configuration or attached to a support member. FIG. 1B is a schematic illustration of an individual die 120 after it has been singulated from the wafer 110 shown in FIG. 1A. The die 120 can include operable microelectronic structures, optionally encased within a protective encapsulant. The die 120 can be electrically connected to external structural devices by pins, bond pads, solder balls, redistribution structures, and/or other conductive structures.

Figure 2:
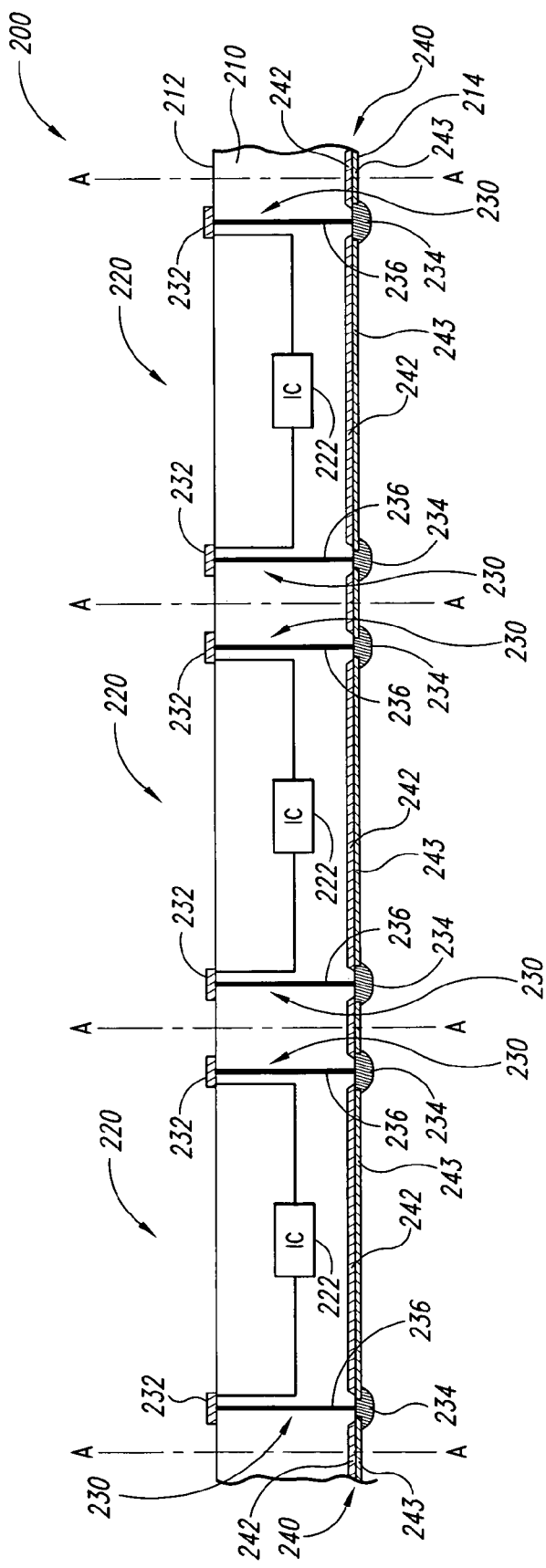
FIG. 2 is a partially schematic, side cross-sectional view of a portion of a microfeature workpiece including one or more interconnects coupled to a backplane structure in accordance with several embodiments of the invention.

FIG. 2 is a partially schematic, side cross-sectional view of a portion of a microfeature workpiece 200 configured in accordance with several embodiments of the invention. More specifically, FIG. 2 illustrates the workpiece 200 after a plurality of interconnects have been formed in the workpiece 200 and one or more of the interconnects have been selectively coupled to a backplane structure 240 to provide EMI shielding and/or grounding for the various components of the workpiece 200. The microfeature workpiece 200 includes a semiconductor substrate 210 having a front or active side 212, a back side 214, and a plurality of microelectronic dies 220 formed on and/or in the substrate 210. The workpiece 200 can include several features generally similar to the workpiece 100 described above with reference to FIG. 1A. The substrate 210, for example, can be a semiconductor wafer with the dies 220 arranged in a die pattern on the wafer. Individual dies 220 can include integrated circuitry 222 and electrical connectors 230 electrically coupled to the integrated circuitry 222. Although the illustrated dies 220 have the same structure, in other embodiments the dies 220 can have different features to perform different functions.

The connectors 230 shown in FIG. 2 provide a small array of back side contacts within the footprint of each die 220. Individual connectors 230, for example, can include a terminal or bond site 232 (e.g., a bond-pad), a conductive coupler 234 (e.g., a solder ball or other external interconnect structure), and an interconnect 236 coupling the terminal 232 to the conductive coupler 234. In the embodiment illustrated in FIG. 2, the terminals 232 are at the front side 212 of the substrate 210, the conductive couplers 234 are at the back side 214 of the substrate 210, and the interconnects 236 are through-substrate or through-wafer interconnects that extend completely through the substrate 210 to couple the terminals 232 to corresponding conductive couplers 234. In other embodiments, however, the terminals 232 can be internal features that are embedded at an intermediate depth within the substrate 210 and coupled to corresponding conductive couplers 234 with interconnects 236 that extend through only a portion of the substrate 210. The conductive couplers 234 can be attached either before or after singulating the dies 220 from the workpiece 200.

The workpiece 200 further includes the backplane structure 240 at the back side 214 of the substrate 210. The backplane structure 240 can include, for example, a metal or conductive "shield" layer 242 on and/or in the substrate 210 and a dielectric layer 243 on the shield layer 242. In several embodiments, the backplane structure 240 can also include more dielectric layers (not shown) and/or other structures, or the backplane structure 240 may not include a dielectric layer. Various embodiments of the backplane structure 240 are described in detail below. As mentioned previously, one or more of the interconnects 236 can be selectively coupled to the backplane structure 240 to provide EMI shielding and/or grounding. More specifically, the backplane structure 240 can be configured such that (a) the individual conductive couplers 234 contact both the corresponding interconnect 236 and the portion of the conductive layer 242 adjacent to the associated interconnect 236 to electrically connect the interconnect to the backplane structure 240, or (b) the individual conductive couplers 234 contact only the corresponding interconnect 236 and remain electrically isolated from the conductive layer 242. After coupling selected interconnects 236 to the backplane structure 240, the workpiece 200 can be cut along lines A-A to singulate the dies 220. Various embodiments of the backplane structure 240 and processes for selectively coupling one or more of the interconnects 236 to the backplane structure 240 are discussed in greater detail below.

In contrast with conventional unshielded BGA devices described previously, several embodiments of the interconnects 236 and the backplane structure 240 enable devices having small arrays of back side contacts (e.g., ball-grid arrays) to use conductive backplanes. Electrically coupling one or more of the interconnects 236 to the backplane 240 can accordingly provide EMI shielding and grounding for such devices. The back side arrays of electrical connectors also allow the dies 220 to be stacked on other dies or directly attached to an interposer substrate without peripheral wirebonds. The individual dies 220 accordingly have a significantly smaller footprint and profile than conventional stacked devices including wire-bonds or other conventional devices with backplanes. Thus, the dies 220 can be used in smaller electronic devices and the problems associated with EMI or other electromagnetic radiation in such high density packaged devices can be mitigated.

In the embodiment illustrated in FIG. 2, formation of the interconnects 236 and the backplane structure 240 is complete. FIGS. 3A-5D described below illustrate various embodiments of backplane structures and methods for forming such structures. Although the following description illustrates only two interconnects adjacent to a portion of the backplane structure, it will be appreciated that (a) a plurality of interconnects are constructed simultaneously through a plurality of dies on a wafer, and (b) the backplane structure is fabricated across all or a substantial portion of the workpiece.

Figure 3A:
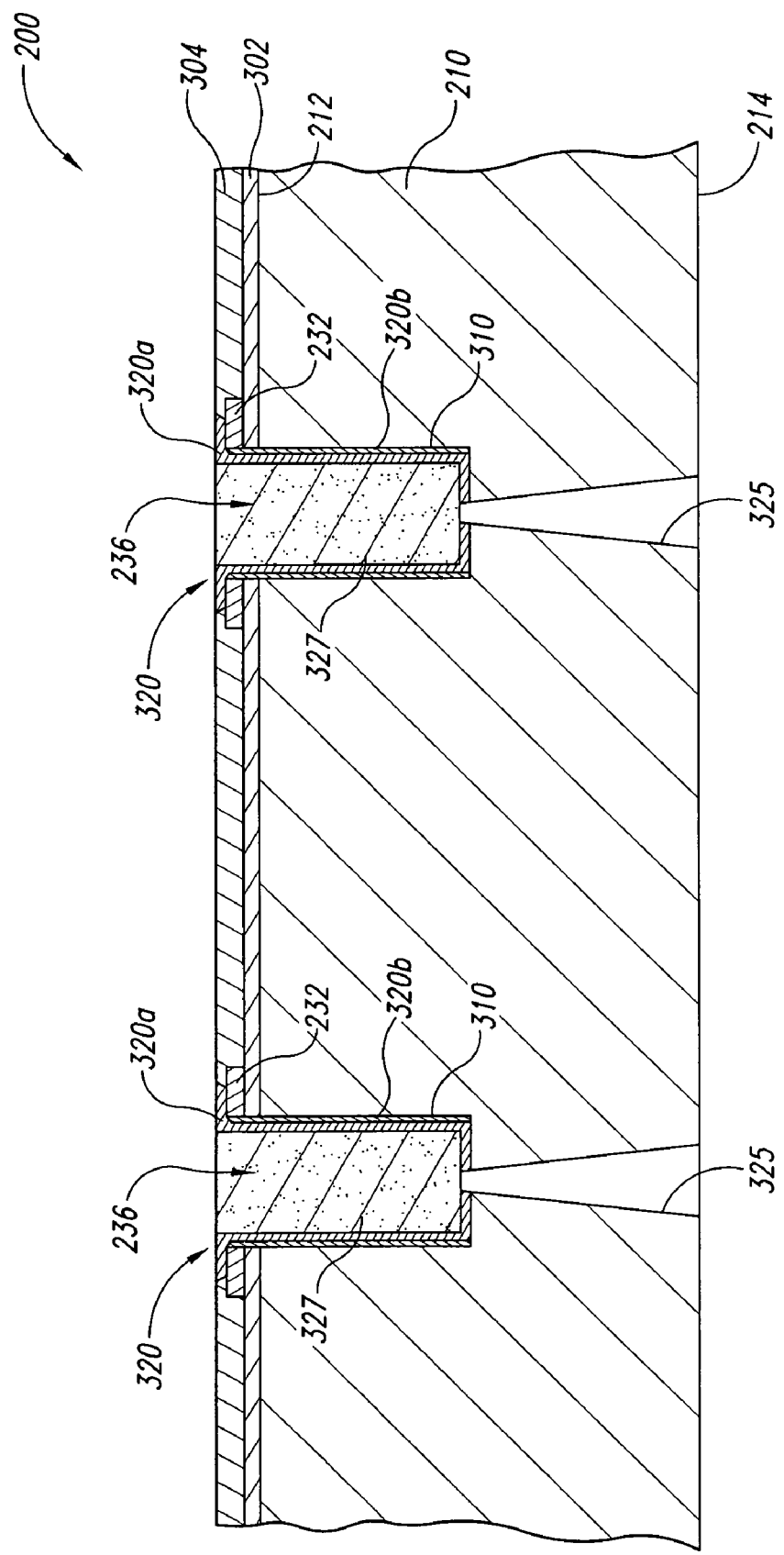

FIGS. 3A-3F illustrate various stages of a method for forming one embodiment of the backplane structure 240 of FIG. 2. FIG. 3A, more specifically, is a schematic, side cross-sectional view of a portion of the workpiece 200 at an early stage of this process after constructing a substantial portion of an embodiment of the interconnect 236, but before forming the backplane structure. More specifically, the workpiece 200 has dielectric layers 302 and 304 over at least a portion of the front side 212 of the substrate 210 to protect the substrate 210 and the terminals 232. The dielectric layers 302 and 304 and/or one or more of the subsequent dielectric layers can be parylene, low temperature chemical vapor deposition (CVD) materials, such as silicon nitride ($Si_3Ni_4$), silicon oxide ($SiO_2$), and/or other suitable dielectric materials. The foregoing list of dielectric materials is not exhaustive. The dielectric layers 302 and 304 are not generally composed of the same material as each other, but these layers may be composed of the same material. In addition, one or both of the dielectric layers 302 and 304 may be omitted and/or additional layers may be included.

The workpiece 200 also includes a plurality of vias or apertures 310 formed through at least part of the substrate 210 using etching, laser drilling, or other suitable techniques. The illustrated vias 310 are blind vias that extend only partially through the substrate 210 or are otherwise closed at one end. In other embodiments, however, the vias 310 can extend entirely through the workpiece 200 and/or the substrate 210. Further details of representative methods for forming vias 310 are disclosed in pending U.S. patent application Ser. No. 11/027,443, filed Dec. 30, 2004, and incorporated herein by reference in its entirety.

The vias 310 are generally lined with another dielectric layer 320b and one or more conductive layers 320a (shown collectively as liner 320). The embodiment of the liner 320 is shown schematically as two layers, but in many embodiments the liner 320 has a number of different dielectric and conductive materials. The dielectric layer 320b of the liner 320 electrically insulates the components in the substrate 210 from the interconnects that are subsequently formed in each via 310. The dielectric layer 320b can include materials similar to those of the dielectric layers 302 and 304 described above. The conductive layer(s) 320a of the liner 320 can include tantalum (Ta), tungsten (W), copper (Cu), nickel (Ni), and/or other suitable conductive materials.

After lining the vias 310, vent holes 325 are formed in the substrate 210 to extend from a bottom portion of each via 310 to the back side 214 of the substrate 210. After forming the vent holes 325, a fill material 327 is deposited into each via 310 to form the interconnects 236. The fill material 327 can include Cu, Ni, silver (Ag), gold (Au), solder, a conductive polymer, a non-conductive polymer, or other suitable materials or alloys of materials having the desired fill properties. The vent holes 325 allow trapped air, gases, or volatile solvents to escape from the larger vias 310 when filling the vias with the fill material 327. The vent holes 325 are an optional structure that can be omitted in several embodiments.

Referring next to FIG. 3B, the substrate 210 is thinned to a desired thickness "T" by removing material from the back side 214 of the substrate 210. In the illustrated embodiment, a back side portion 237 of each interconnect 236 is at least partially exposed after removing material from the back side 214. In one embodiment, the initial thickness of the substrate 210 is approximately 750 μm, and the final thickness T is approximately 100-500 μm. The initial and final thicknesses can be different in other embodiments. The back side 214 of the substrate 210 can be thinned using chemical-mechanical planarization (CMP) processes, dry etching processes, chemical etching processes, chemical polishing, grinding procedures, or other suitable processes.

Referring to FIG. 3C, the back side 214 of the substrate 210 is etched back to further expose the back side portions 237 of each interconnect 236, thus forming conductive "posts" 238. In other embodiments, other suitable processes in addition to, or in lieu of, the etching process can be used to offset the back side 214 of the substrate 210 from the ends of the interconnects 236 to form the posts 238. After etching the back side 214, a first dielectric layer 330 is deposited onto the back side 214 of the substrate 210 and over the posts 238. The first dielectric layer 330 can be a low temperature CVD oxide or other suitable dielectric material, such as one of the materials described above with reference to FIG. 3A. A conductive or metal layer 332 is then deposited over the first dielectric layer 330. The conductive layer 332 is an embodiment of the metal or conductive layer 242 shown in FIG. 2. The conductive layer 332 can be composed of aluminum (Al), Cu, Ni, W, a conductive polymer, or another suitable conductive material. In practice, a layer composed of titanium, tantalum or another suitable material is generally deposited on the dielectric layer 330 to provide a barrier layer and/or an adhesion layer, and then the conductive layer 332 is deposited on the barrier/adhesion layer.

Figure 3D:
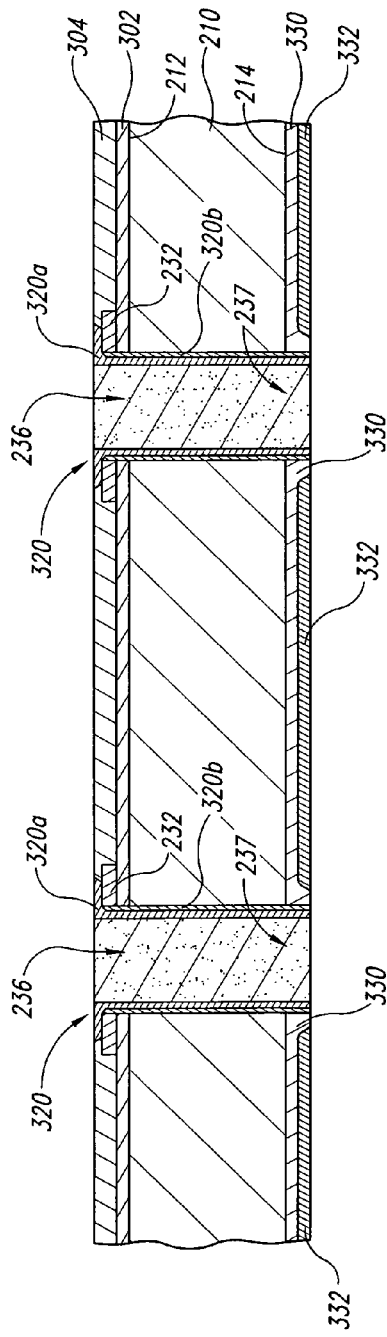

FIG. 3D illustrates the workpiece 200 after the portions of the conductive layer 332 and the first dielectric layer 330 on the ends of the posts 238 (FIG. 3C) have been removed to expose the back side portions 237 of each interconnect 236. In this embodiment, for example, the overburden portions of the conductive layer 332 and the first dielectric layer 330 are removed from the workpiece 200 by pressing the workpiece 200 against a planarizing medium and moving the workpiece and/or the planarizing medium relative to each other in a CMP process. As a result, the conductive layer 332 has a planarized surface and the first dielectric layer 330 has a planarized portion proximate to and at least generally surrounding each interconnect 236 to electrically insulate the conductive layer 332 from the interconnects 236. In other embodiments, the overburden portions of the conductive layer 332 and the first dielectric layer 330 can be removed using an etching process in lieu of, or in addition to, the CMP process.

Figure 3E:
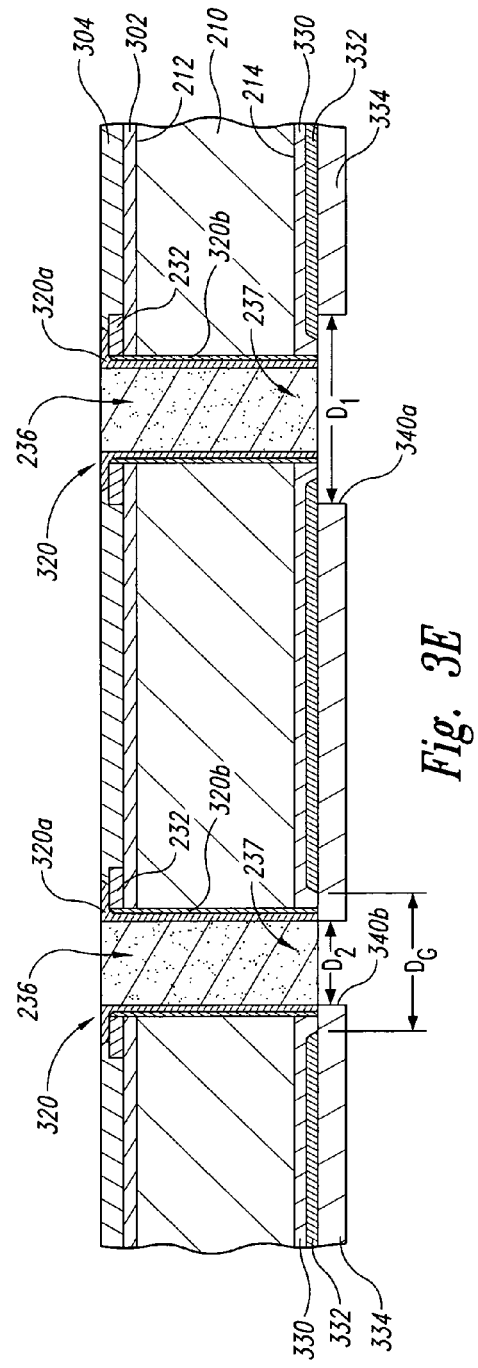

Referring next to FIG. 3E, a second dielectric layer or "cap" layer 334 is applied to the back side 214 of the substrate 210 over the remaining portions of the first dielectric layer 330, the conductive layer 332, and the exposed back side portions 237 of the interconnects 236. The second dielectric layer 334 can include a low temperature CVD oxide (e.g., $SiO_2$), a photosensitive polyimide, or another suitable dielectric material. After depositing the second dielectric layer 334, a plurality of openings 340 including a first opening 340a and a second opening 340b are formed in the second dielectric layer 334 to expose the back side portions 237 of the interconnects 236 and, in some cases, a portion of the conductive layer 332. If the second dielectric layer 334 is a low temperature CVD oxide, the first and second openings 340a and 340b can be formed by patterning and etching the second dielectric layer 334 to form the openings. For example, the first and second openings 340a and 340b can be etched using one or more etching steps that selectively remove the material from the second dielectric layer 334 compared to the interconnects 236 and the conductive layer 332. Alternatively, if the second dielectric layer 334 is a photosensitive polyimide material, a photolithographic procedure is used to selectively expose portions of the second dielectric layer 334, and the exposed portions of the second dielectric layer 334 are developed to form the first and second openings 340a and 340b. In other embodiments, other suitable techniques and/or processes can be used to form the first and second openings 340a and 340b.

The dimensions and/or alignment of the first and second openings 340a and 340b can be used to selectively control which interconnects 236 will be electrically coupled to the conductive layer 332. The sizes of the openings 340a and 340b in this embodiment depend upon the diameter $D_G$ of the holes in the conductive layer 332 formed during the CMP process. For example, the first opening 340a has a first diameter or cross-sectional dimension $D_1$ greater than $D_G$ to enable electrical connection between the conductive layer 332 and the interconnect 236 at the opening 340a, but the second opening 340b has a second diameter or cross-sectional dimension $D_2$ less than $D_G$ to prevent electrical connection between the conductive layer 332 and the interconnect 236 at the opening 340b. The first diameter $D_1$ of the first opening 340a is sized such that both the back side portion 237 of the corresponding interconnect 236 and at least a portion of the conductive layer 332 adjacent to the interconnect 236 is exposed. Conversely, the second diameter $D_2$ of the second opening 340b is sized such that the portions of the conductive layer 332 adjacent to the second opening 340b are covered by the second dielectric layer 334 to ensure electrical isolation between the corresponding interconnect 236 and the conductive layer 332. In one embodiment, the second opening 340b is configured so that only the backside portion 237 of the associated interconnect 236 is exposed.

Figure 3F:
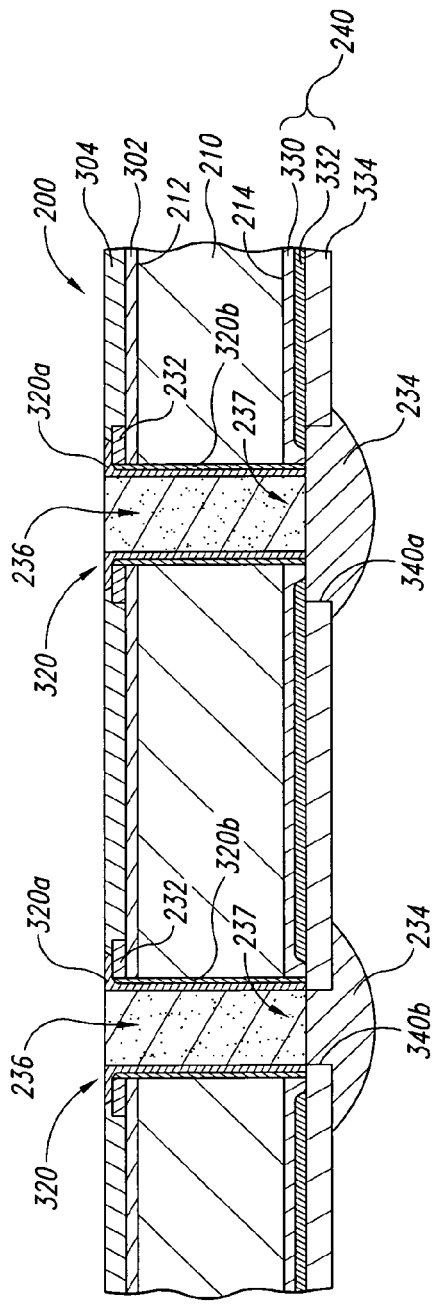

Referring to FIG. 3F, the conductive couplers 234 are attached to the back side portions 237 of each interconnect 236 to (a) selectively couple particular interconnects 236 to the conductive layer 332 of the backplane structure 240, and (b) provide an external connection to other electronic devices at the back side 214 of the workpiece 200. More specifically, the conductive coupler 234 in the first opening 340a is in electrical contact with both the interconnect 236 and the conductive layer 332 to electrically couple the corresponding interconnect 236 to the backplane 240. In contrast, the conductive coupler 234 in the second opening 340b is electrically coupled to the corresponding interconnect 236, but the size and/or alignment of the second opening 340b prevent the conductive coupler 234 from contacting the conductive layer 332. This interconnect 236 accordingly remains electrically isolated from the backplane 240. Any number of interconnects 236 within a particular die 220 (FIG. 2) can be selectively coupled to the backplane 240 based on the particular specifications or operational requirements of the resulting device.

As discussed previously, electrically coupling one or more of the interconnects 236 to the backplane 240 can provide EMI shielding and/or grounding for devices having small arrays of back side contacts, such as the dies 220 (FIG. 2) and the resulting packaged devices. Embodiments of the method described above with reference to FIGS. 3A-3F are also expected to mitigate the problems associated with "floating" backplanes in which a conductive backplane is present in a particular device but is not electrically coupled to the circuitry in the device. As discussed above, for example, electrically and physically coupling one or more interconnects 236 to the backplane 240 with the conductive couplers 234 can provide a robust connection between the device's circuitry and the backplane 240.

In one embodiment, a microfeature device comprises a semiconductor substrate having a front side, a back side, integrated circuitry and terminals electrically coupled to the integrated circuitry. The device also includes electrically conductive interconnects, electrically coupled to the terminals. The interconnects extend through at least a portion of the semiconductor substrate and have back side portions at the back side of the substrate. The device further includes a conductive backplane at the back side of the semiconductor substrate, and one or more of the interconnects are electrically coupled to the conductive layer at the back side of the semiconductor substrate.

In another embodiment, a microfeature workpiece comprises a semiconductor substrate having a front side, a back side, and a plurality of microelectronic dies on and/or in the substrate. The individual dies include integrated circuitry and bond-pads electrically coupled to the integrated circuitry. The workpiece also includes a plurality of electrically conductive through-substrate interconnects electrically coupled to corresponding bond-pads. The workpiece further includes a shield layer at the back side of the semiconductor substrate. First interconnects of individual dies are electrically coupled to the shield layer, and second interconnects of individual dies are electrically isolated from the shield layer.

In still another embodiment, a microelectronic device includes a semiconductor substrate having integrated circuitry and bond-pads electrically coupled to the integrated circuitry. The device also includes electrically conductive through-substrate interconnects in contact with corresponding bond-pads and having back side portions. The device further includes an EMI shield at a back side of the semiconductor substrate for EMI shielding. The back side portion of at least one interconnect is electrically coupled to the EMI shielding, and the back side portion of at least one other interconnect is electrically isolated from the EMI shield.

In yet another embodiment, a microfeature workpiece includes a semiconductor substrate having a front side, a back side, and a plurality of microelectronic dies on and/or in the semiconductor substrate. The individual dies include integrated circuitry, an array of bond-pads electrically coupled to the integrated circuitry, and a plurality of electrically conductive through-substrate interconnects electrically coupled to corresponding bond-pads. The dies also include a back side metal layer. One or more of the interconnects are electrically coupled to the metal layer. The workpiece further includes a plurality of scribe lines spacing apart the individual dies.

In still another embodiment, a microelectronic device includes a semiconductor substrate having a front side, a back side opposite the front side, integrated circuitry, and an array of bond-pads at the front side of the substrate electrically coupled to the integrated circuitry. The device also includes a plurality of electrically conductive interconnects extending through the substrate. The interconnects have front side portions electrically coupled with corresponding bond-pads and back side post portions at the back side of the substrate. The device further includes a conductive layer at the back side of the substrate. The conductive layer has an array of openings aligned with corresponding interconnects such that the back side post portions of the interconnects extend through the openings in the conductive layer. The device also includes dielectric spacers in the openings between the conductive layer and the back side post portions of the corresponding interconnects. The back side post portions of first interconnects are electrically coupled to the conductive layer, and the back side post portions of second interconnects are electrically isolated from the conductive layer.

Another embodiment is directed toward a method of processing a semiconductor substrate. The semiconductor substrate includes integrated circuitry and a plurality of terminals electrically coupled to the integrated circuitry. The method includes forming a plurality of electrically conductive interconnects extending at least partially through the substrate and in contact with corresponding terminals. The interconnects have back side portions at a back side of the semiconductor substrate. The method also includes constructing a conductive backplane at a back side of the semiconductor substrate. The method further includes electrically coupling at least one of the back side portions of the interconnects to the backplane, and electrically isolating at least one other interconnect from the backplane.

Another embodiment is directed toward yet another method of processing a semiconductor substrate having a plurality of microelectronic dies. The individual dies include an integrated circuit and bond-pads electrically coupled to the integrated circuit. The method includes constructing a plurality of electrically conductive through-substrate interconnects extending at least partially through the semiconductor substrate and in contact with corresponding bond-pads. The method also includes forming a metal layer at a back side of the semiconductor substrate. The method further includes selectively coupling a back side portion of first interconnects of individual dies to the metal layer, while keeping second interconnects of individual dies electrically isolated from the metal layer.

Still another embodiment is directed toward a method of fabricating a semiconductor substrate. The semiconductor substrate has integrated circuitry, a plurality of bond-pads electrically coupled to the integrated circuitry, and a plurality of electrically conductive through-substrate interconnects in contact with corresponding bond-pads. The method includes forming an EMI shield at a back side of the semiconductor substrate that does not directly contact the interconnects. The method further includes coupling an interconnect to the shield with a solder ball in direct physical contact with a back side portion of the interconnect and a corresponding portion of the shield.

Figure 4A:
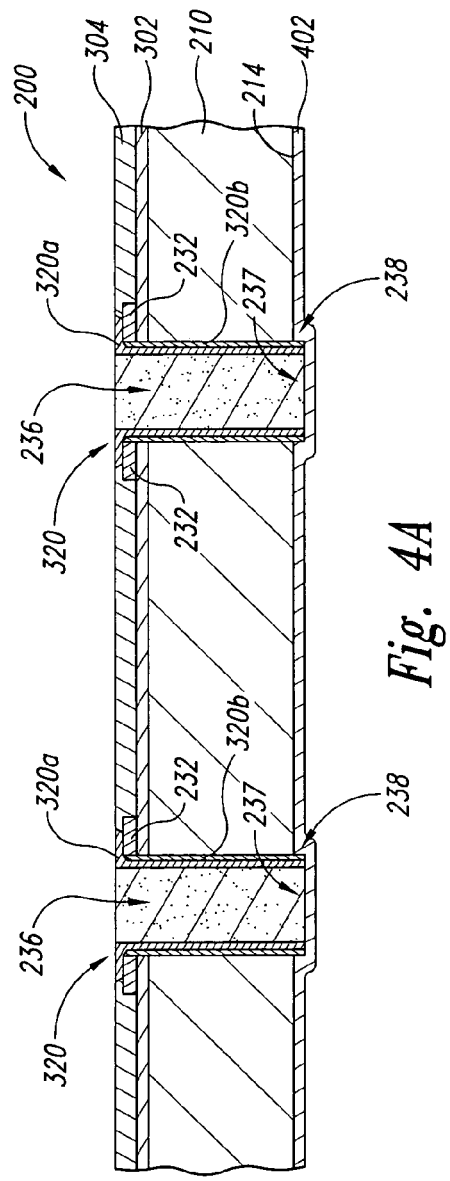

FIGS. 4A-4C are schematic, side cross-sectional views illustrating various stages of a method for forming another embodiment of the backplane structure 240 shown in FIG. 2. The initial stages of this method are at least generally similar to the steps described above with reference to FIGS. 3A-3C, and as such FIG. 4A shows a workpiece configuration similar to that illustrated in FIG. 3C. The subsequent stages of this method, however, differ from that described above with reference to FIGS. 3A-3F in that a dielectric layer is not deposited over the back side 214 of the substrate 210. Instead, a conductive or metal layer 402 is deposited directly onto the back side 214 and over the exposed back portions 237 of the interconnects 236. The conductive layer 402 can include an argon (Ar) pre-sputter followed by deposition of a barrier/adhesion layer of titanium, tantalum or another suitable material, which is then followed by deposition of a aluminum or another conductive material.

FIG. 4B illustrates the workpiece 200 after the overburden portions of the conductive layer 402 have been removed to expose the back side portions 237 of each interconnect 236. The overburden portions of the conductive layer 402 can be removed from the workpiece 300 using a CMP process or etching process similar to those described above with reference to FIG. 3D. In other embodiments, however, another suitable technique can be used to remove the desired portions of the conductive layer 402.

Referring next to FIG. 4C, a first dielectric layer 404 is applied to the back side 214 of the substrate 210 over the conductive layer 402 and the exposed back side portions 237 of the interconnects 236. The first dielectric layer 404 can include a low temperature CVD oxide, a photosensitive polyimide, or another suitable dielectric material similar to those described previously. After depositing the first dielectric layer 404, a plurality of openings 406 (two are shown as a first opening 406a and a second opening 406b) are formed in the first dielectric layer 404 to expose the back side portions 237 of the interconnects 236 and, in some cases, a portion of the conductive layer 402 adjacent to the interconnects 236. The first and second openings 406a and 406b can be formed using processes or techniques similar to those described above with reference to FIG. 3E. As discussed previously, the chosen technique depends largely on the composition of the first dielectric layer 404.

Similar to the first opening 340a, the second opening 340b, and the diameter $D_G$ of the openings in the conductive layer described above with reference to FIG. 3E, the dimensions and/or alignment of the first and second openings 406a and 406b shown in FIG. 4C can be used to selectively control which interconnects 236 will be electrically coupled to the conductive layer 402. In this case, the diameter $D_G$ of the holes in the conductive layer 402 corresponds to the dielectric layer 320b lining the interconnects 236. For example, the first opening 406a has a third diameter or cross-sectional dimension $D_3$ larger than $D_G$ and the second opening 406b has a fourth diameter or cross-sectional dimension $D_4$ less than $D_G$. As such, the third diameter $D_3$ is sized such that both the interconnect 236 and a portion of the conductive layer 402 adjacent to the interconnect 236 are exposed, but the fourth diameter $D_4$ is sized such that the dielectric layer 404 prevents a solder ball from electrically coupling the interconnect 236 at the second opening 406b to the conductive layer 402. A conductive coupler 410 (e.g., a solder ball or other external interconnect structure) in the first opening 406a accordingly electrically couples the associated interconnect 236 to the conductive layer 402 of the backplane structure, but another conductive coupler 410 in the second opening 406b is electrically coupled only to the corresponding interconnect 236 and remains electrically isolated from the backplane structure.

The methods for forming the backplane structure described above with reference to FIGS. 3A-4D include (a) a single CMP step to remove the overburden portions of the conductive layer and/or the dielectric layer, and (b) a single masking step to selectively form openings over the interconnects having the desired dimensions and alignment. Using only a single CMP step and a single masking step provides an efficient process to fabricate the backplane structure. Furthermore, reducing the amount of processing also mitigates the potential for damage to and/or contamination of the workpiece 200 that can result from CMP or other rigorous processes.

FIGS. 5A-5D are schematic, side cross-sectional views illustrating various stages of a method for forming still another embodiment of the backplane structure 240 shown in FIG. 2. Referring first to FIG. 5A, the initial stages of this method are at least generally similar to the steps described above with reference to FIGS. 3A and 3B, but the back side 214 of the substrate 210 is not etched or otherwise recessed back to form the conductive posts 238 (FIG. 3C). Instead, after thinning the substrate 210 to the desired thickness, a conductive layer 502 is deposited over the back side 214 of the substrate 210 and the exposed back side portions 237 of each interconnect 236 to provide the material for the conductive backplane. The conductive layer 502 can include conductive materials generally similar to those described above with reference to FIG. 3C and FIG. 4A.

After depositing the conductive layer 502, a first mask 504 is applied over the conductive layer 502. The first mask 504 can be a layer of resist that is patterned according to the arrangement of the interconnects 236 and the desired configuration of the resulting backplane structure. In the embodiment shown in FIG. 5A, for example, the first mask 504 has an opening 505 over one of the interconnects 236, and then an opening 506 is formed through the conductive layer 502 to expose the corresponding interconnect 236 and at least a portion of the back side 214 of the substrate 210. The opening 506 can be formed using etching or another suitable process. The first mask 504 can be removed.

Referring to FIG. 5B, a first dielectric layer 508 is deposited onto the workpiece 300 over the conductive layer 502 and into the opening 506 such that the first dielectric layer 508 covers the exposed back side portions of the interconnects 236 and the substrate 210. The first dielectric layer 508 can include a low temperature CVD oxide or another suitable dielectric material. A second mask 510 is subsequently applied over the first dielectric layer 508 and patterned to form openings over the interconnects 236.

Referring next to FIG. 5C, a plurality of openings 512 (two are shown as a first opening 512a and a second opening 512b) are formed in the first dielectric layer 508 using an etching process or another suitable technique. The first opening 512a exposes the back side portion 237 of the corresponding interconnect 236, and the second opening 512b exposes the conductive layer 508. In one embodiment, the etching process selectively removes the material of the dielectric layer 508 faster than the material of the conductive layer 502 or the interconnect 236. FIG. 5D illustrates the workpiece 200 after conductive couplers 520 have been deposited into the respective first and second openings 512a and 512b. The conductive coupler 520 in the first opening 512a is electrically coupled to the corresponding interconnect 236, but is electrically isolated from the conductive layer 502. On the other hand, the conductive coupler 520 in the second opening 512b is directly electrically coupled to the conductive layer 502, thus electrically coupling the corresponding interconnect 236 to the backplane structure.

Figure 6:
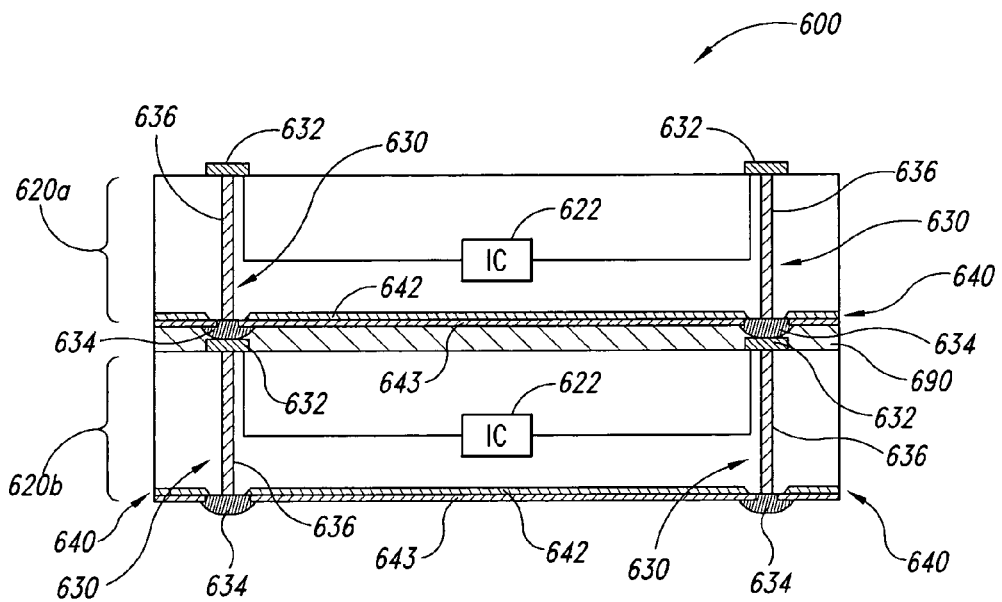
FIG. 6 is a schematic, side cross-sectional view of a packaged microelectronic device in accordance with one embodiment of the invention.

FIG. 6 is a schematic, side cross-sectional view of a packaged microelectronic device 600 configured in accordance with an embodiment of the invention. The microelectronic device 600 includes a plurality of microelectronic dies 620 (individually identified as a first microelectronic die 620a and a second microelectronic die 620b) interconnected in a stacked-die arrangement. The first and second microelectronic dies 620a and 620b can have many components at least generally similar to the microelectronic dies 220 discussed above and illustrated in FIG. 2. For example, the first and second dies 620a and 620b can each include integrated circuitry 622 and connectors 630 electrically coupled to the integrated circuitry 622. Each connector 630 can include a terminal 632 (e.g., a bond-pad), a conductive coupler 634 (e.g., a solder ball or other external interconnect structure), and an interconnect 636 extending through the respective die coupling the terminal 632 to the conductive coupler 634. The first and second dies 620a and 620b also include a backplane structure 640 at a back side of the individual dies including, for example, a conductive layer 642 and a dielectric layer 643 on the respective dies. The backplane structure 640 can be constructed using any of the methods described above with respect to FIGS. 3A-5D.

In the illustrated embodiment, the conductive couplers 634 of the first upper die 620a are coupled to corresponding terminals 632 of the second lower die 620b to electrically connect the first die 620a to the second die 620b. A suitable underfill material 690 or other compound can optionally be used to structurally attach the first and second dies 620a and 620b together in the illustrated stacked-die configuration. Additionally, the conductive couplers 634 at the back side of the second die 620b can in turn be used to electrically connect the microelectronic device 600 to another external device or board.

In one embodiment, for example, a microelectronic assembly includes a first microelectronic device and a second microelectronic device coupled to the first device in a stacked configuration. The first device has a first microelectronic die with a first integrated circuit and an array of first bond-pads electrically coupled to the first integrated circuit. The first die also includes first electrically conductive interconnects extending at least partially through the first die and in contact with corresponding first bond-pads. The first die further includes a first conductive backplane assembly having a first conductive layer at a back side of the first die, with at least one first interconnect electrically coupled to the first conductive layer. The second device has a second microelectronic die with a second integrated circuit and an array of second bond-pads electrically coupled to the second integrated circuit. The second die also includes second electrically conductive interconnects extending at least partially through the second die and in contact with corresponding second bond-pads. The second die further includes a second conductive backplane assembly having a second conductive layer at a back side of the second die, with at least one second interconnect electrically coupled to the second conductive layer.

Figure 7:
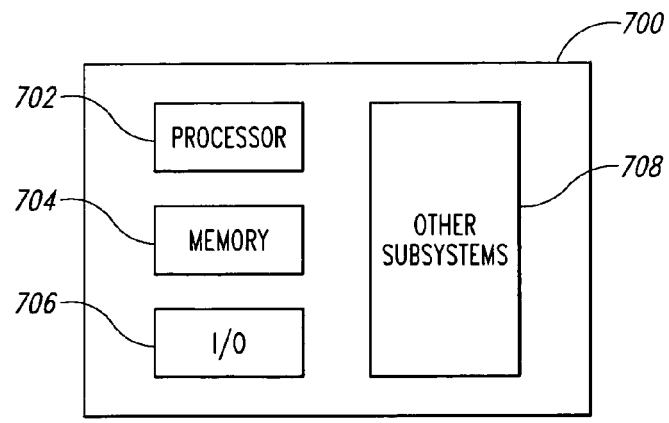
FIG. 7 is a schematic illustration of a system that can include one or more microelectronic devices configured in accordance with embodiments of the invention.

The stacked microelectronic device 600 or any one of the microelectronic devices formed using the methods described above with reference to FIGS. 1A-6 can be incorporated into any of a myriad of larger and/or more complex systems 700, a representative one of which is shown schematically in FIG. 7. The system 700 can include a processor 702, a memory 704 (e.g., SRAM, DRAM, DDR-SDRAM, flash memory, such as NAND flash memory or other types of flash memory, and/or other suitable memory devices), input/output devices 706, and/or other subsystems or components 708. Microelectronic devices and/or microfeature workpieces (e.g., in the form of microfeature dies and/or combinations of microfeature dies) may be included in any of the components shown in FIG. 7. The resulting system 700 can perform any of a wide variety of computing, processing, storage, sensor, imagers, and/or other functions. Accordingly, representative systems 700 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini-computers. Other representative systems 700 include cameras, light or other radiation sensors, servers and associated server subsystems, display devices, and/or memory devices. In such systems, individual dies can include imager arrays, such as a CMOS imager. Components of the system 700 may be housed in a single unit or distributed over multiple, interconnected units, e.g., through a communications network. Components can accordingly include local and/or remote memory storage devices and any of a wide variety of computer-readable media.

From the foregoing, it will be appreciated that specific embodiments of the invention have been described herein for purposes of illustration, but that various modifications may be made without deviating from the invention. For example, structures and/or processes described in the context of particular embodiments may be combined or eliminated in other embodiments. In particular, the backplane structures described above with reference to particular embodiments can include one or more additional dielectric or conductive layers, or one or more of the layers described above can be omitted. Further, the connections between the interconnects, backplane structures, and other devices (e.g., bond pads, conductive couplers, and/or external devices) can have arrangements different than those described above. In several embodiments, for example, the electrical connectors can include ball-pads at the back side of the dies and electrically coupled to corresponding interconnects and conductive couplers. Accordingly, the invention is not limited except as by the appended claims.

I claim:

1. A microelectronic device, comprising:
   a semiconductor substrate including integrated circuitry and terminals electrically coupled to the integrated circuitry;
   electrically conductive interconnects extending through at least a portion of the semiconductor substrate and electrically coupled to corresponding terminals; and
   a conductive backplane assembly comprising
      a conductive layer at a back side of the semiconductor substrate, wherein the conductive layer includes an array of openings aligned with corresponding interconnects such that back side post portions of the interconnects extend through at least a portion of the respective openings in the conductive layer; and
      dielectric spacers in the openings between the conductive layer and the back side post portions of the corresponding interconnects, wherein at least one interconnect is electrically coupled to the conductive layer, and wherein at least one other interconnect is electrically isolated from the conductive layer.

2. The microelectronic device of claim 1 wherein the electrically conductive interconnects comprise a first interconnect and a second interconnect, and wherein the microelectronic device further comprises:
   a first conductive coupler attached to the first interconnect and in electrical contact with the conductive layer at the back side of the semiconductor substrate; and
   a second conductive coupler attached to the second interconnect, wherein the second conductive coupler is electrically isolated from the conductive layer.

3. The microelectronic device of claim 1 wherein:
   the electrically conductive interconnects comprise a first interconnect and a second interconnect; and
   the conductive backplane assembly further comprises
      a first dielectric layer on the back side of the substrate and in contact with the first and second interconnects;
      the conductive layer over at least a portion of the first dielectric layer and having openings around the first and second interconnects, wherein portions of the first dielectric layer are in the openings between the conductive layer and the first and second interconnects; and
      a second dielectric layer over the first dielectric layer and the conductive layer, the second dielectric layer including a first opening over the first interconnect and a second opening over the second interconnect, wherein the first opening is sized to expose a back side portion of the first interconnect, a portion of the first dielectric layer adjacent to the first interconnect, and a portion of the conductive layer adjacent to the first interconnect, and wherein the second opening is sized to expose a back side portion of the second interconnect without exposing the conductive layer adjacent to the second interconnect; and
   the device further comprises (a) a first conductive coupler in the first opening and in contact with the first interconnect and the exposed portion of the conductive layer adjacent to the first interconnect, and (b) a second conductive coupler in the second opening and in contact with the second interconnect, wherein the second conductive coupler is electrically isolated from the conductive layer.

4. The microelectronic device of claim 3 wherein:
   the first dielectric layer comprises a low temperature CVD oxide;
   the conductive layer comprises Al, Cu, Ni, W, and/or a conductive polymer; and
   the second dielectric layer comprises a low temperature CVD oxide and/or a photosensitive polyimide.

5. The microelectronic device of claim 1 wherein:
   the electrically conductive interconnects comprise a first interconnect and a second interconnect;
   the conductive layer on the back side of the substrate has openings around the first and second interconnects, and wherein the conductive backplane assembly further comprises
      a dielectric layer over the conductive layer, the dielectric layer including a first opening over the first interconnect and a second opening over the second interconnect, wherein the first opening is sized to expose a back side portion of the first interconnect and a portion of the conductive layer adjacent to the first interconnect, and wherein the second opening is sized to expose a back side portion of the second interconnect without exposing the conductive layer; and
   the device further comprises (a) a first conductive coupler in the first opening and in contact with the first interconnect and the exposed portion of the conductive layer adjacent to the first interconnect, and (b) a second conductive coupler in the second opening and in contact with the second interconnect, wherein the second conductive coupler is electrically isolated from the conductive layer.

6. The microelectronic device of claim 5 wherein:
   the conductive layer comprises an argon pre-sputter, at least one of a titanium layer and a tantalum layer, and an aluminum layer; and
   the dielectric layer comprises a low temperature CVD oxide and/or a photosensitive polyimide.

7. The microelectronic device of claim 1 wherein:
   the electrically conductive interconnects comprise a first interconnect and a second interconnect; and
   the conductive layer on the back side of the substrate has a first opening around the first interconnect and the conductive layer directly contacts an end of the second interconnect, and wherein the conductive backplane assembly further comprises
      a dielectric layer over the conductive layer, the dielectric layer including a first opening over the first interconnect to expose a back side portion of the first interconnect, and a second opening aligned with the second interconnect to expose the conductive layer over a back side portion of the second interconnect; and
   the device further comprises (a) a first conductive coupler in the first opening and in contact with the first interconnect, wherein the first conductive coupler is electrically isolated from the conductive layer, and (b) a second conductive coupler in the second opening and in direct contact with the conductive layer.

8. The microelectronic device of claim 7 wherein:
   the conductive layer comprises Al, Cu, Ni, W, and/or a conductive polymer; and
   the dielectric layer comprises a low temperature CVD oxide and/or a photosensitive polyimide.

9. A microelectronic device, comprising:
a semiconductor substrate including a front side, a back side opposite the front side, integrated circuitry, and an array of bond-pads at the front side electrically coupled to the integrated circuitry;
a plurality of electrically conductive interconnects extending through the substrate, the interconnects having first portions electrically coupled with corresponding bond-pads and second portions at the back side;
a metal layer at the back side of the semiconductor substrate having an array of openings aligned with corresponding interconnects, wherein the second portion of at least one of the interconnects is received in a corresponding opening;
a dielectric layer over the metal layer, the dielectric layer having openings aligned with the interconnects; and
a plurality of solder balls attached to corresponding interconnects at the back side of the semiconductor substrate, wherein at least one of the solder balls is configured to electrically couple the integrated circuitry to the metal layer within the footprint of the semiconductor substrate and at least one solder ball is electrically isolated from the metal layer.

10. The microelectronic device of claim 9 wherein the metal layer comprises at least one of Al, Cu, Ni, and W deposited over a layer of at least one of titanium and tantalum.

11. The microelectronic device of claim 9 wherein the plurality of electrically conductive interconnects comprises a first interconnect and a second interconnect and the dielectric layer comprises a second dielectric layer, and wherein
the microelectronic device further comprises a first dielectric layer on the back side of the substrate and in contact with the first and second interconnects, wherein the first dielectric layer isolates the metal layer from direct contact with the substrate and the first and second interconnects;
the second dielectric layer includes a first opening having a first cross-sectional dimension over the first interconnect and a second opening having a second cross-sectional dimension less than the first cross-sectional dimension over the second interconnect, wherein the first opening is sized to expose the second portion of the first interconnect and a portion of the metal layer adjacent to the first interconnect, and wherein the second opening is sized to expose only the second portion of the second interconnect, and
the plurality of solder balls attached to corresponding interconnects at the back side of the semiconductor substrate comprises (a) a first solder ball in the first opening and in contact with the first interconnect and the adjacent portion of the metal layer, and (b) a second solder ball in the second opening and in contact with the second interconnect, wherein the second solder ball is electrically isolated from the metal layer.

12. The microelectronic device of claim 9 wherein the plurality of electrically conductive interconnects comprises a first interconnect and a second interconnect, and wherein:
the dielectric layer includes a first opening having a first cross-sectional dimension over the first interconnect and a second opening having a second cross-sectional dimension less than the first cross-sectional dimension over the second interconnect, wherein the first opening is sized to expose the second portion of the first interconnect and a portion of the metal layer adjacent to the first interconnect, and wherein the second opening is sized to expose only the second portion of the second interconnect, and
the plurality of solder balls attached to corresponding interconnects at the back side of the semiconductor substrate comprises (a) a first solder ball in the first opening and in contact with the first interconnect and the adjacent portion of the metal layer, and (b) a second solder ball in the second opening and in contact with the second interconnect, wherein the second solder ball is electrically isolated from the metal layer.

13. A microelectronic device, comprising:
a semiconductor substrate including integrated circuitry and bond-pads electrically coupled to the integrated circuitry;
electrically conductive through-substrate interconnects in contact with corresponding bond-pads and having back side portions; and
an EMI shield at a back side of the semiconductor substrate for EMI shielding, the EMI shield comprising
a conductive layer having apertures aligned with corresponding interconnects, wherein the back side portions of the interconnects extend through at least a portion of the corresponding apertures;
a dielectric layer over the metal layer, the dielectric layer having openings aligned with the interconnects; and
a plurality of conductive couplers attached to corresponding interconnects at the back side of the semiconductor substrate, wherein the back side portion of at least one interconnect is electrically coupled to the EMI shield with one of the conductive couplers, and wherein the back side portion of at least one other interconnect and corresponding conductive coupler is electrically isolated from the EMI shield.

14. The microelectronic device of claim 13 wherein the interconnects are positioned to electrically couple the integrated circuitry to the EMI shield within the footprint of the semiconductor substrate.

15. A microelectronic assembly, comprising:
a first microelectronic device having
a first microelectronic die with a first integrated circuit and an array of first bond-pads electrically coupled to the first integrated circuit;
first electrically conductive interconnects extending at least partially through the first die and in contact with corresponding first bond-pads; and
a first conductive backplane assembly comprising
a first conductive layer at a back side of the first die, wherein the first conductive layer includes an array of first openings aligned with corresponding first interconnects such that back side post portions of the first interconnects are accessible through the first openings in the first conductive layer; and
first dielectric spacers in the first openings between the first conductive layer and the back side post portions of the corresponding first interconnects, wherein at least one first interconnect is electrically coupled to the first conductive layer and at least one other first interconnect is electrically isolated from the first conductive layer; and
a second microelectronic device coupled to the first microelectronic device in a stacked configuration, the second microelectronic device having
a second microelectronic die with a second integrated circuit and an array of second bond-pads electrically coupled to the second integrated circuit;
second electrically conductive interconnects extending at least partially through the second die and in contact with corresponding second bond-pads; and a second conductive backplane assembly comprising
a second conductive layer at a back side of the second die, wherein the second conductive layer includes an array of second openings aligned with corresponding second interconnects such that back side post portions of the second interconnects are accessible through the firs second t openings in the second conductive layer; and
second dielectric spacers in the second openings between the second conductive layer and the back side post portions of the corresponding second interconnects, wherein at least one second interconnect is electrically coupled to the second conductive layer and at least one other second interconnect is electrically isolated from the second conductive layer.

16. The microelectronic assembly of claim 15 wherein the first device is a memory device and the second device is an imager.

17. The microelectronic assembly of claim 15 wherein the first device is a processor and the second device is an imager.

18. The microelectronic assembly of claim 15 wherein the first device is a NAND flash memory and the second device is a random access memory device.

19. The microelectronic assembly of claim 15 wherein the first device and the second device are memory devices.

20. A microelectronic device, comprising:
a semiconductor substrate including a front side, a back side opposite the front side, integrated circuitry, and an array of bond-pads at the front side of the substrate electrically coupled to the integrated circuitry;
a plurality of electrically conductive interconnects extending through the substrate, the interconnects having front side portions electrically coupled with corresponding bond-pads, and back side post portions at the back side of the substrate;
a conductive layer at the back side of the substrate having an array of openings aligned with corresponding interconnects such that the back side post portions of the interconnects extend through the openings in the conductive layer; and
dielectric spacers in the openings between the conductive layer and the back side post portions of the corresponding interconnects, wherein the back side post portions of first interconnects are electrically coupled to the conductive layer, and the back side post portions of second interconnects are electrically isolated from the conductive layer.

21. The microelectronic device of claim 20, further comprising:
a dielectric cover layer over the conductive layer and the back side post portions of the first and second interconnects, the cover layer including first openings over the first interconnects and second openings over the second interconnects, wherein the first openings are sized to expose the back side post portions of the first interconnects and a portion of the conductive layer adjacent to the first interconnects, and wherein the second openings are sized to expose only the back side post portions of the interconnects;
first conductive couplers in the first openings and in contact with the back side post portions of the first interconnects and the exposed portions of the conductive layer proximate to the corresponding first interconnects; and
second conductive couplers in the second openings and in contact with the back side post portions of the second interconnects, wherein the second conductive couplers are electrically isolated from the conductive layer.

22. A microfeature workpiece including a semiconductor substrate having a front side and a back side, the workpiece comprising:
a plurality of microelectronic dies on and/or in the semiconductor substrate, the individual dies including integrated circuitry, an array of bond-pads electrically coupled to the integrated circuitry, a plurality of electrically conductive through-substrate interconnects electrically coupled to corresponding bond-pads, a back side metal layer having an array of openings aligned with corresponding interconnects such that back side post portions of the interconnects extend through at least a portion of the respective openings, and dielectric spacers in the openings between the back side metal layer and the back side post portions of the corresponding interconnects, wherein at least one of the interconnects is electrically coupled to the metal layer, and wherein at least one other interconnect is electrically isolated from the metal layer; and
a plurality of scribe lines spacing apart the individual dies.

* * * * *

UNITED STATES PATENT AND TRADEMARK OFFICE
CERTIFICATE OF CORRECTION

| | | |
|---|---|---|
| PATENT NO. | : 7,902,643 B2 | Page 1 of 1 |
| APPLICATION NO. | : 11/514568 | |
| DATED | : March 8, 2011 | |
| INVENTOR(S) | : Mark E. Tuttle | |

It is certified that error appears in the above-identified patent and that said Letters Patent is hereby corrected as shown below:

In column 17, line 7, in Claim 15, delete "firs second t" and insert -- second --, therefor.

Signed and Sealed this
Tenth Day of May, 2011

David J. Kappos
*Director of the United States Patent and Trademark Office*